United States Patent
Asghari et al.

(10) Patent No.: US 8,463,088 B1
(45) Date of Patent: Jun. 11, 2013

(54) MULTI-CHANNEL OPTICAL DEVICE

(75) Inventors: Mehdi Asghari, Pasadena, CA (US); Dazeng Feng, El Monte, CA (US)

(73) Assignee: Kotura, Inc., Monterey Park, CA (US)

( * ) Notice: Subject to any disclaimer, the term of this patent is extended or adjusted under 35 U.S.C. 154(b) by 182 days.

(21) Appl. No.: 13/136,601

(22) Filed: Aug. 4, 2011

Related U.S. Application Data

(60) Provisional application No. 61/403,490, filed on Sep. 16, 2010.

(51) Int. Cl.
| | |
|---|---|
| G02B 6/12 | (2006.01) |
| G02B 6/00 | (2006.01) |
| G02B 6/26 | (2006.01) |
| G02B 6/28 | (2006.01) |
| H04J 14/02 | (2006.01) |
| H01S 3/00 | (2006.01) |
| H01S 3/08 | (2006.01) |
| H01S 3/10 | (2006.01) |

(52) U.S. Cl.
USPC .......... 385/14; 385/2; 385/3; 385/24; 385/27; 385/32; 385/47; 385/48; 385/122; 385/140; 398/82; 398/93; 372/21; 372/23; 372/92; 372/93; 372/97; 372/99; 359/333

(58) Field of Classification Search
USPC ............... 385/1–5, 14, 24, 27, 32, 39, 45, 47, 385/48, 122, 140; 398/79, 82, 83, 85, 93; 372/6, 372/21, 23, 92, 93, 99; 359/333
See application file for complete search history.

(56) References Cited

U.S. PATENT DOCUMENTS 7,542,641 B1 * 6/2009 Asghari et al. .................. 385/39

* cited by examiner

*Primary Examiner* — Uyen Chau N Le
*Assistant Examiner* — Michael Mooney
(74) *Attorney, Agent, or Firm* — Gavrilovich, Dodd & Lindsey, LLP

(57) ABSTRACT

The multi-channel optical device includes multiple laser cavities that each reflects a different light channel back and forth between reflective components. One of the reflective components is common to all of the laser cavities in that the common reflective component receives the channels from each of the laser cavities and reflects the received channels. The laser cavities also share a multiplexer that receives the channels reflected by the common reflective device and demultiplexes the channels into demultiplexed channels. A portion of the reflective components are partial return devices that each receives one of the demultiplexed channels. Each of the partial return devices transmits a portion of the demultiplexed channel received by that partial return device. The transmitted portion of the demultiplexed channel exits the laser cavity. Additionally, each of the partial return devices reflects a portion of the demultiplexed channel receive by that partial return device. The multiplexer also receives the transmitted portion of the channels and multiplexes the transmitted portions into an output beam.

18 Claims, 15 Drawing Sheets

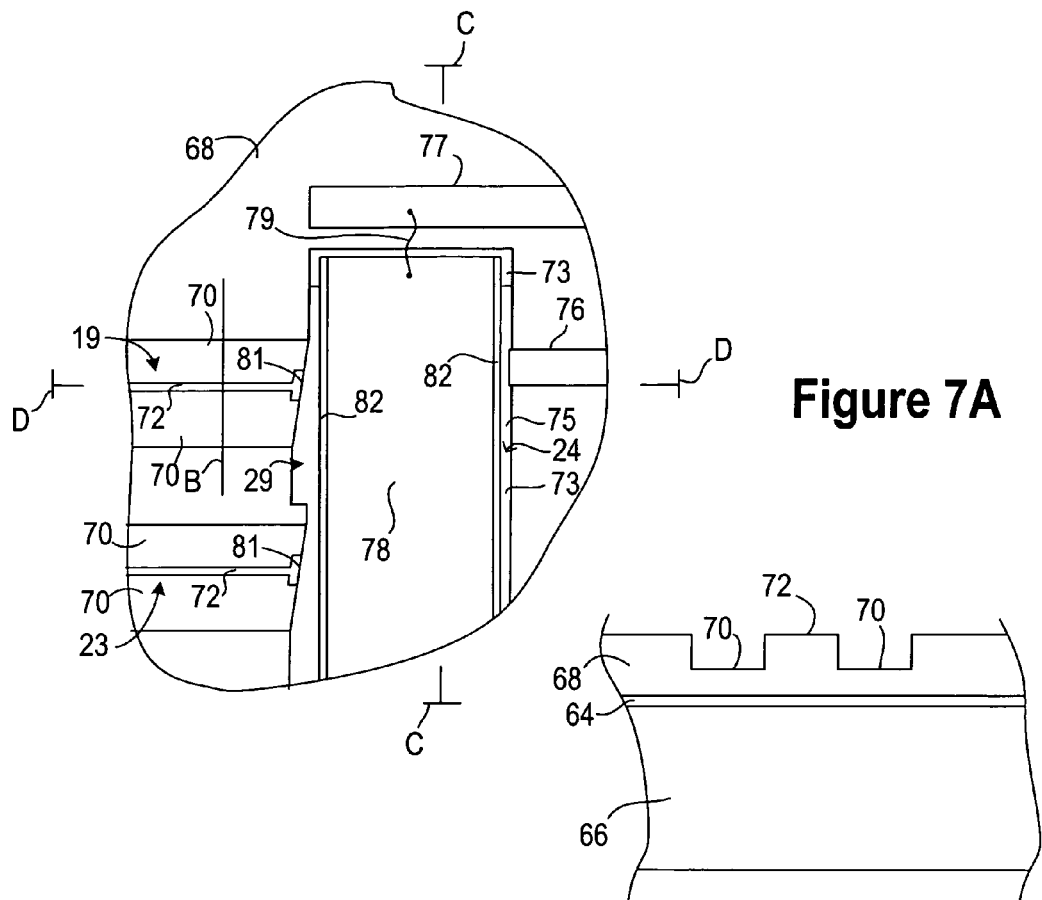
Figure 7A
Figure 7B
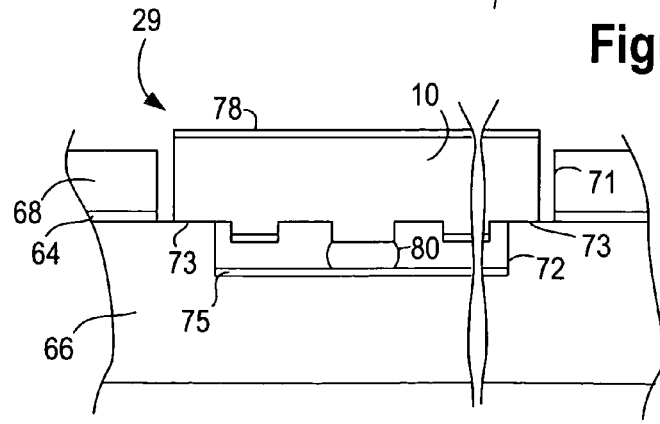
Figure 7C

MULTI-CHANNEL OPTICAL DEVICE

RELATED APPLICATIONS

This application claims the benefit of U.S. Provisional Patent Application Ser. No. 61/403,490, filed on Sep. 16, 2010, entitled "Multi-Channel Optical Device," and incorporated herein in its entirety. This application is related to U.S. patent application Ser. No. 11/998,846, now U.S. Pat. No. 7,542,641, filed on Nov. 30, 2007, and entitled "Multi-Channel Optical Device" and also to U.S. patent application Ser. No. 12/800,047, filed on May 6, 2010, and entitled "Multi-Channel Optical Device," each of which is incorporated herein in its entirety.

FIELD

The present invention relates to optical devices and more particularly to devices for creating a light beam that includes multiple channels.

BACKGROUND

Optical communication systems employ waveguides to carry optical channels. The waveguides preferably carry a plurality of optical channels in order to increase the capacity of the system. These channels are generated by lasers. Fabry-perot (FP) lasers emit a broad range of wavelengths but the emission spectrum is not easily controlled. The spectrum changes with temperature and current and is not capable of high-speed transmission or over long spans. In response, distributed feedback (DFB) lasers were generated. While DFB lasers are able to emit over a narrow spectrum they are only capable of generating a single wavelength channel. As a result, multiple DFB lasers are often employed to generate the desired number of channel. However, DFB lasers are substantially more expensive that FP lasers. As a result, using multiple DFB lasers can cause an undesirable increase in the cost of the system. Accordingly, there is a need for an economical optical device that can produce a plurality of channels such that each channel has a narrow range of wavelengths.

SUMMARY

The multi-channel optical device includes multiple laser cavities that each reflects a different light channel back and forth between reflective components. One of the reflective components is common to all of the laser cavities in that the common reflective component receives the channel from each one of the laser cavities and reflects the received channels. The laser cavities also share a multiplexer that receives the channels reflected by the common reflective device and demultiplexes the channels into demultiplexed channels. A portion of the reflective components are partial return devices that each receives one of the demultiplexed channels. Each of the partial return devices transmits a portion of the demultiplexed channel received by that partial return device. Each of the transmitted portions exits one of the laser cavities through the partial return device. Additionally, each of the partial return devices reflects a portion of the demultiplexed channel received by that partial return device. The multiplexer also receives the transmitted portion of the channels and multiplexes the transmitted portions into an output beam.

BRIEF DESCRIPTION OF THE FIGURES

FIG. 7A through FIG. 7D illustrate the portion of a multi-channel device having an interface between different waveguides and a gain medium chip.
FIG. 7A is a topview of the multi-channel device.
FIG. 7B is a cross section of the cavity waveguide shown in FIG. 7A taken along the line labeled B.
FIG. 7C is a cross section of the multi-channel device shown in FIG. 7A taken along a line extending between the brackets labeled C in FIG. 7A.
FIG. 7D is a cross section of the multi-channel device shown in FIG. 7A taken along a line extending between the brackets labeled D in FIG. 7A.
FIG. 8A is a topview of the multi-channel device.
FIG. 8B is a cross section of the multi-channel device taken along the line labeled B in FIG. 8A.
FIG. 9A is a topview of the multi-channel device. The coupler includes a channel waveguide and a coupled waveguide.
FIG. 9B is a cross section of the coupled waveguide and the channel waveguide taken along the line labeled B in FIG. 9A.
FIG. 9C is a cross section of the coupled waveguide taken along a line between the brackets labeled C in FIG. 9A.
FIG. 10A is a topview of the mach-zehnder interferometer. The mach-zehnder interferometer includes a channel waveguide that branches into a first branch waveguide and a second branch waveguide. The first branch waveguide re-joins the second branch waveguide at a modulated waveguide. A phase modulator is positioned along the second branch waveguide.
FIG. 10B is a topview of a phase modulator that is suitable for use with the mach-zehnder interferometer of FIG. 10A.

FIG. 10C is a cross section of the phase modulator shown in FIG. 10B taken along the line labeled C in FIG. 10B.

FIG. 10D through FIG. 10E illustrate the effects of tuning the phase modulator on the second branched waveguide.

DESCRIPTION

A multi-channel device includes multiple laser cavities. In each of the laser cavities light travels back and forth between reflective components such as mirrors. As the light signal travels back and forth between the reflective components, the multi-light signals travel through a multiplexer that multiplexes these light signals and then demultiplexes the light into channels. As a result, the laser cavities share the multiplexer. Each of the laser cavities includes a partial reflection device that each receives one of the channels and transmits a portion of the received channel. The transmitted portion of the channel exits the associated laser cavity through the partial reflection device and becomes the output of that laser cavity. The presence of the multiplexer in each of the laser cavities reduces the range of wavelengths that are lased by the device. As a result, the channels output from each laser cavity has a narrow range of wavelengths.

After the channels exit from the laser cavities, they are again received at the multiplexer. The multiplexer combines the channels into an output beam. Accordingly, a single multiplexer operates to reduce the range of wavelengths in each channel, to multiplex the light signals from different laser cavities, to demultiplex the light signals from different laser cavities into channels in the laser cavity, and also to multiplex the output from different laser cavities into an output beam. Since the multiplexer performs the functions of multiple components, the multi-channel device can have a reduced size while still providing a multiple channel output where each channel has a narrow range of wavelengths.

The laser cavity includes one or more gain media that each generates the light signals in response to the application of energy to the gain medium. In some instances, the gain medium is a quantum dot gain medium configured to produce a variety of different wavelengths. When a non-quantum dot gain medium is used, the different channels compete for lasing within the gain medium. The competition between the different channels results in different channels having different intensities relative to one another. When a quantum dot gain medium is used, competition between different channels is reduced or even eliminated. As a result, the use of the quantum dot gain medium can stabilize the output from the device.

Figure 1A:
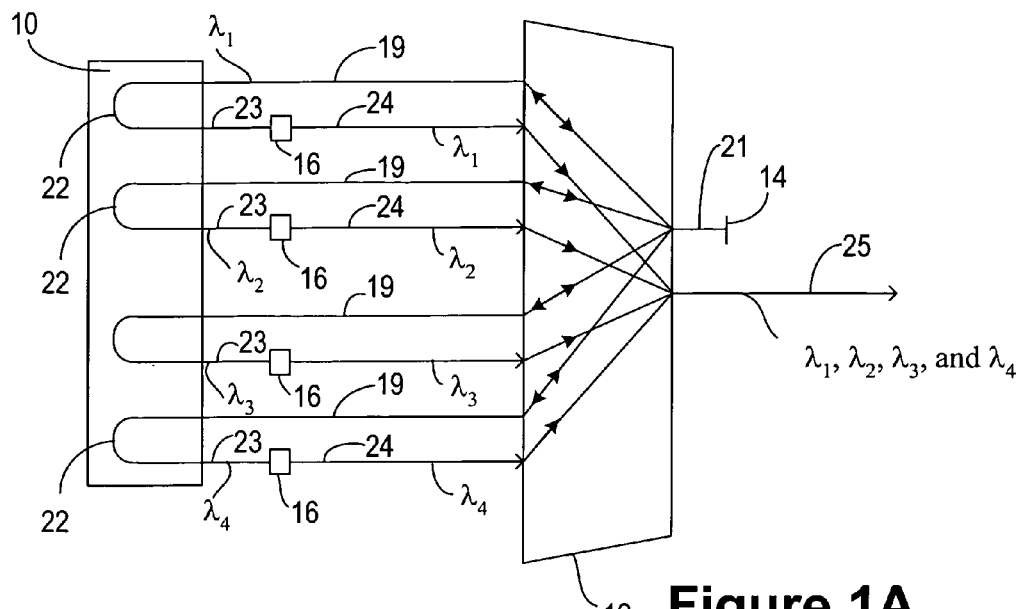
FIG. 1A is schematic view of a multi-channel device.

FIG. 1A is a schematic diagram of a multi-channel device. The multi-channel device includes a gain medium 10 and a demultiplexer/multiplexer (multiplexer 12) optically positioned between a common reflector 14 and a plurality of partial return devices 16. Suitable multiplexers 12 include, but are not limited to, echelle gratings, AWG demultiplexers, transmission gratings, reflection gratings and other dispersive elements. The common reflector 14 is preferably highly reflective or even 100% reflective. Suitable common reflectors 14 include, but are not limited to, mirrors, reflective metals, partially or fully metal coated waveguide facets. The partial return devices 16 are configured to return a portion of a light signal along its original path and to permit another portion of the light signal to travel along a different path. Suitable partial return devices 16 include, but are not limited to, partially reflective surfaces, optical couplers where the coupled waveguide has a reflective facet, partially etch facets, and narrow etched gaps. As will become evident below, the device includes multiple laser cavities where each laser cavity is defined by the common reflector 14 and one of the partial return devices 16. Accordingly, the common reflector 14 is shared by each of the laser cavities.

During operation of the multi-channel device, each of the gain media 10 receives energy from a power source 18. The energy received from the power source can be optical or electrical. In response to receiving the energy, a gain medium emits a light beam having a broad range of wavelength as defined by the material properties of the gain medium. Cavity waveguides 19 each guides the light beam to a multiplexer 12. The multiplexer 12 multiplexes the light signals. A multiplexed signals waveguide 21 guides the multiplexed light signals to the common reflector 14 which reflects the multiplexed light signals back onto the multiplexed signals waveguide 21. The multiplexed signals waveguide 21 guides the multiplexed light signals back to the multiplexer 12. The multiplexer 12 demultiplexes the light signals into a set of channels where each channel includes a range of wavelengths. The channels are illustrated in FIG. 1A as $\lambda_1$, $\lambda_2$, $\lambda_3$, and $\lambda_4$. Wavelengths outside of the channels are blocked by the multiplexer 12 by virtue of experiencing a high level of loss caused by the multiplexer 12. As a result, the multiplexer 12 provides each laser cavity with wavelength selectivity.

Each of the cavity waveguides 19 receives a different one of the channels $\lambda_1$, $\lambda_2$, $\lambda_3$, $\lambda_4$. Each of the cavity waveguides 19 guides a different one of the channels $\lambda_1$, $\lambda_2$, $\lambda_3$, $\lambda_4$ to the gain medium 10. Gain waveguides 22 are defined in the gain medium 10. Each of the gain waveguides 22 receives a different one of the channels $\lambda_1$, $\lambda_2$, $\lambda_3$, $\lambda_4$ and guides the received channel to a second cavity waveguide 23. Each of the second cavity waveguides 23 guides one of the channels $\lambda_1$, $\lambda_2$, $\lambda_3$, $\lambda_4$ to one of the partial return device 16. Each partial return device 16 returns a first portion of the received channel to the second cavity waveguides 23 that carried that channel to the partial return device 16. The first portion of each channel that is returned to a second cavity waveguides 23 returns to the gain medium 10 and then to the common reflector 14. Accordingly, the channels travel back and forth between the common reflector 14 and the partial return device 16.

As the channels travel back and forth between the common reflector 14 and the partial return device 16 the channels travel through the gain medium 10 where they are amplified and lase. Since the wavelengths outside the channels have a high level of loss due to the multiplexer 12, these wavelengths are not amplified and do not lase. The distribution of wavelengths in a channel together with the competition of the wavelengths in the channels for a limited gain results in lasing of a narrower range wavelengths than the demultiplexer selects. As a result, the range of wavelengths that lase in each channel is actually smaller than the range of wavelengths included in the channel.

As noted above, the partial return devices 16 each return a first portion of a channel to the demultiplexer 12. A second portion of each channel exits one of the laser cavities through a different partial return device 16. Accordingly, the partial return devices 16 each include a port through which each channel exits from one of the laser cavities. In some instances, channels that exit one of the laser cavities serve as the output of the associated laser cavity.

The partial return devices can be tunable. For instance, the partial return devices can be tuned such that the ratio of the first portion of a channel to the second portion of a channel can be tuned. Accordingly, tuning of a partial return device can increase or decrease the power of a particular channel output by the laser. As a result, the partial return devices can be tuned so as to balance the power of different channels.

Channel waveguides 24 each receives the output from one of the partial return devices 16. The channel waveguides 24 guide the received channel to the multiplexer 12. The multiplexer 12 multiplexes the channels into an output beam that contains each of the channels, $\lambda_1$, $\lambda_2$, $\lambda_3$, $\lambda_4$. The device can include an output waveguide 25 that receives and guides the output beam.

The wavelengths included in the channels $\lambda_1$, $\lambda_2$, $\lambda_3$, $\lambda_4$ can be tuned. For instance, the demultiplexer 12 can be a tunable demultiplexer. Tuning the demultiplexer tunes the wavelength of each channel. An example of a suitable tunable AWG demultiplexers are presented in U.S. patent application Ser. No. 09/945,685, filed on Apr. 30, 2001, entitled "Tunable Filter," and now U.S. Pat. No. 6,853,773 and in U.S. patent application Ser. No. 09/993,337, filed on Nov. 13, 2001, entitled "Optical Component Having a Light Distribution Component With an Index of Refraction Tuner," each of which is incorporated herein in its entirety. The tuning principles disclosed in these applications can also be applied to other demultiplexers such as echelle gratings.

Figure 1B:
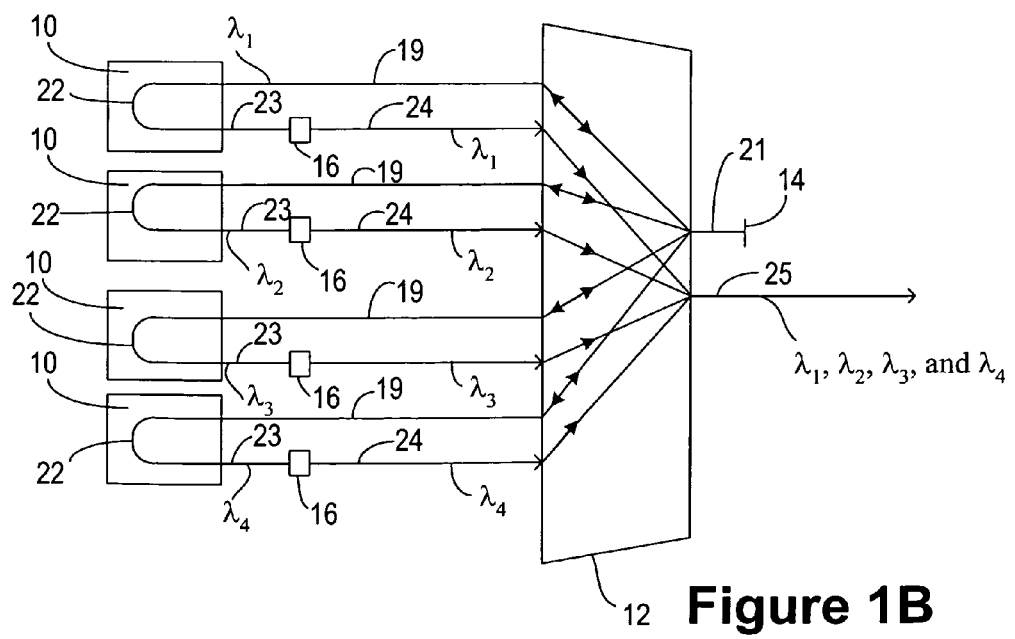
FIG. 1B is schematic view of a multi-channel device.
Figure 1C:
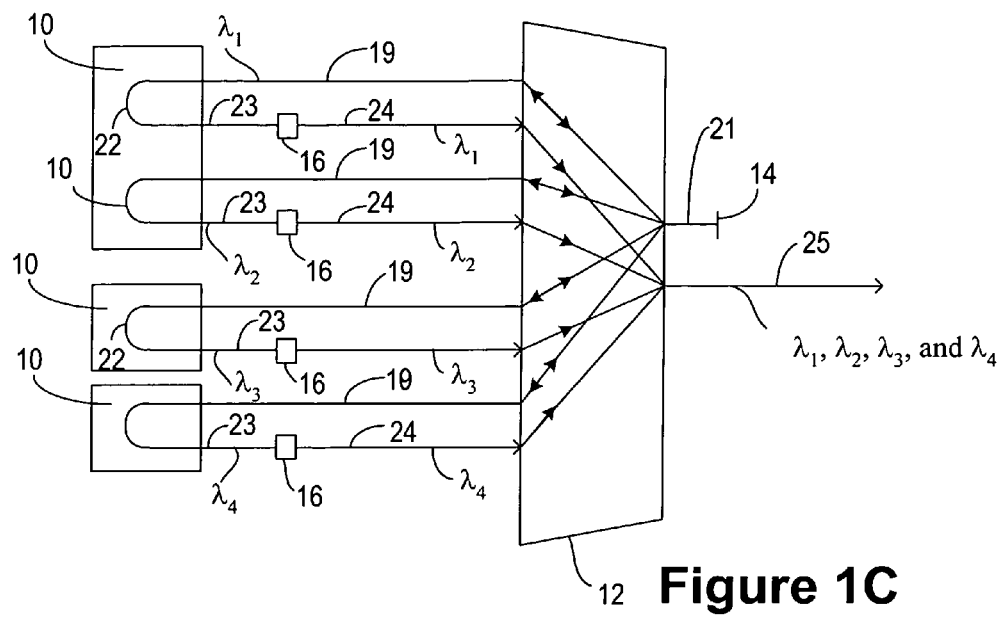
FIG. 1C is schematic view of a multi-channel device.

Although FIG. 1A illustrates a single gain medium 10 receiving each of the channels in that each of the laser cavities shares the same gain medium; however, the optical device can include multiple gain media 10 that each receives a different selection of the channels. For instance, FIG. 1B illustrates an optical device with multiple gain media 10 where each gain medium 10 receives a different one of the channels. Accordingly, each of the laser cavities includes a different gain medium. FIG. 1C illustrates an optical device with multiple gain media 10 where each gain medium 10 receives one or more of the channels. For instance, FIG. 1C illustrates two of the laser cavities sharing a gain medium while two other laser cavities each includes a different gain medium. Reducing the number of channels received by a gain medium 10 allows the gain medium 10 to be tailored and/or selected to the channel to be received by that gain medium 10. For instance, a gain medium can be designed to produce the wavelengths associated with the one or more wavelengths received by that gain medium. Accordingly, different gain medium on the same device may have different compositions and/or composition.

Figure 2:
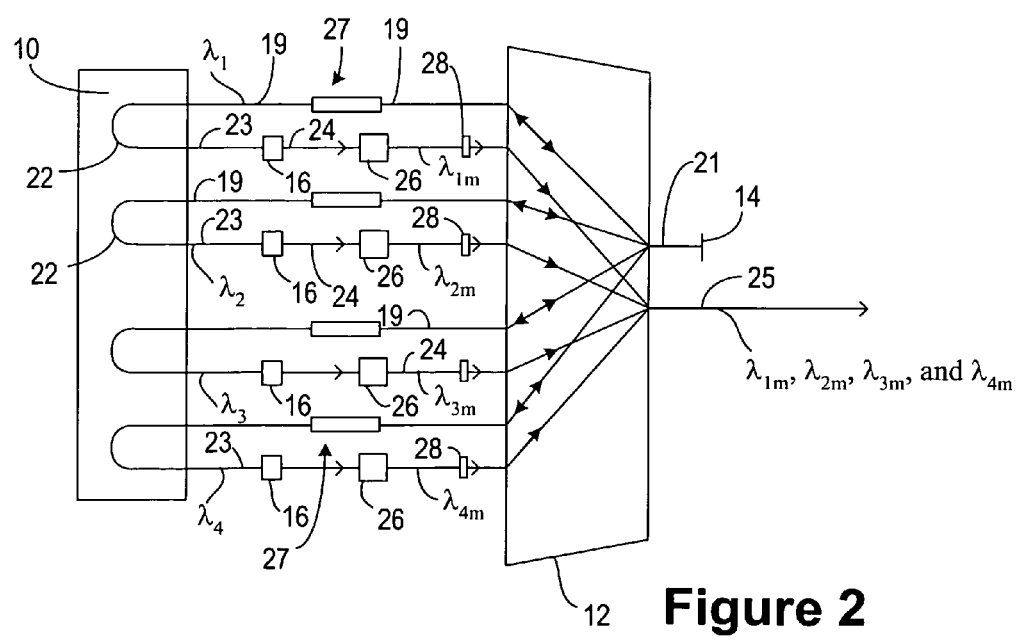
FIG. 2 illustrates an embodiment of the multi-channel device having modulators, optical attenuators, and light monitors.

The multi-channel device can optionally include a variety of different components such as modulators, attenuators, light sensors, light monitors, and phase shifters. For instance, FIG. 2 illustrates the embodiment of the multi-channel device of FIG. 1A having modulators, optical attenuators, and light monitors. Although FIG. 2 illustrates the modulators, optical attenuators, and light monitors on the optical device of FIG. 1A, the optical device of FIG. 1B and FIG. 1C can include the modulators, optical attenuators, and light monitors as shown in FIG. 2.

As is evident from FIG. 2, the multi-channel device can optionally include modulators 26. The modulators can each be positioned to receive one of the channels after the channel exits one of the laser cavities. For instance, FIG. 2 illustrates each modulator positioned along a different one of the channel waveguides 24 such that the each channel waveguide guides one of the channels to the optical modulator 26 and guides the modulated channel away from the optical modulator 26. As a result, each modulator 26 receives the portion of a channel transmitted by a partial return device 16. The modulator 26 can be an intensity modulator such as monolithically integrated silicon modulator or other type of modulators hybridized into a silicon platform. The modulator could also be an intensity modulator that includes a phase modulator. For instance, the modulator could also be a phase modulator used within a Mach Zehnder structure. The modulators 26 permit independent modulation of each channel. Additionally, the presence of the modulators 26 means that the laser can be a continuous wave laser that does not need its own modulation. Since the laser does not need its own modulation, the length of each laser cavity does not substantially affect the output of the multi-channel device.

The modulators 26 each output a modulated channel, $\lambda_{1m}$, $\lambda_{2m}$, $\lambda_{3m}$, $\lambda_{4m}$. The channel waveguides 24 each receive a different one of the modulated channels, $\lambda_{1m}$, $\lambda_{2m}$, $\lambda_{3m}$, $\lambda_{4m}$, and guides the received modulated channel to the multiplexer 12. The multiplexer 12 multiplexes the modulated channels into an output beam that contains each of the modulated channels, $\lambda_{1m}$, $\lambda_{2m}$, $\lambda_{3m}$, $\lambda_{4m}$.

As is evident from FIG. 2, the multi-channel device can optionally include one or more optical attenuators 27 positioned in one or more of the laser cavities. For instance, FIG. 2 shows an optical attenuator positioned along each of the cavity waveguides 19 such that the each cavity waveguide guides one of the channels to the optical attenuator and away from the optical attenuator. Although the optical attenuators 27 are shown positioned along each of the cavity waveguides 19, a portion or all of the optical attenuators 27 can be positioned along each of the second cavity waveguides 23. Accordingly, the optical attenuators 27 are positioned such that each optical attenuator is configured to attenuate the intensity of one of the channels.

One or more of the optical attenuators 27 can be tunable. In one example, all of the optical attenuators 27 are tunable. For instance, one or more of the optical attenuators 27 can be a variable optical attenuator. Tunability of the optical attenuators permits balancing of the power of the different channels to compensate for loss or gain bias inside the laser cavities. In general, the channels having the highest and lowest wavelengths ($\lambda_1$ and $\lambda_4$) see lower gains and higher losses. The attenuators can be employed to increase the loss for the channels with the central wavelengths ($\lambda_2$ and $\lambda_3$). Placement of the optical attenuators in a lasing cavity permits a redistribution of power to take place in the laser cavities such that losses introduced to the channels with the central wavelengths causes a redistribution of gain medium power to the channels having the highest and lowest wavelengths. As a result, a higher average power can be achieved. The redistribution of power within the laser cavity may not be achieved when optical attenuators are positioned outside of the laser cavities.

As is evident from FIG. 2, the multi-channel device can optionally include one or more light monitors. Light monitors can be configured to measure light on a waveguide. For instance, a light monitor can be configured to measure the presence, power and/or intensity of an optical channel or light signal being guided in a waveguide.

The light monitors can be positioned inside of a laser cavity or outside of the laser cavity. For instance, FIG. 2 illustrates light monitors 28 that are each positioned outside of a laser cavity. Additionally, the light monitors of FIG. 2 are positioned after a modulator 26. In particular, the light monitors are positioned along one of the channel waveguides 24 such that each channel waveguide guides one of the channels to one of the light monitors and away from the light monitor.

The output of each light monitor 28 can be employed to control the one or more of the modulators 26 and/or one or more of the optical attenuators. For instance, the output of each light monitor 28 can be employed to control the one or more modulators 26 that are configured to modulate the channel that is monitored by that light monitor and/or the one or more optical attenuators 27 that are configured to attenuate the channel that is attenuated by that light monitor. For instance, the output of each light monitor 28 can be employed in a feedback loop to adjust the optical attenuators 27 such that the power of the different channels at the light monitors is balanced to about the same level.

Figure 3:
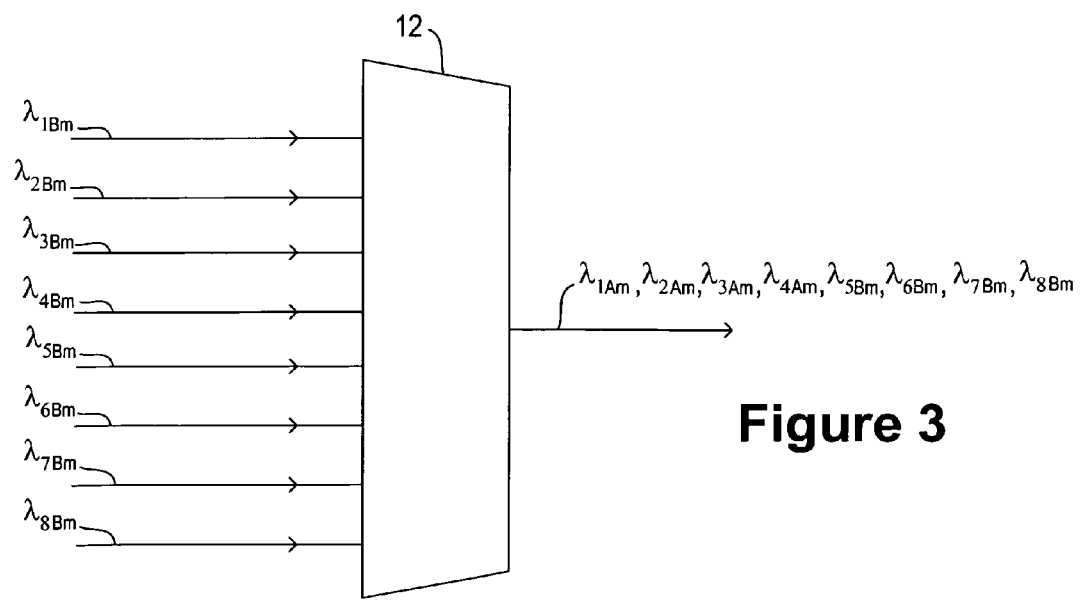
FIG. 3 illustrates combination of channels from different multi-channel devices.

Although the multi-channel devices of FIG. 1A through FIG. 2 are illustrated as producing only four channels, the multi-channel device can be configured to produce more than four channels or fewer than four channels. The modulated channels from several different multi-channel devices can be multiplexed to further increase the number of channels. For instance, the modulated channels labeled $\lambda_{1m}$ through $\lambda_{4m}$ in FIG. 3 could originate from a first gain medium 10 and/or a first laser cavities while the channels labeled $\lambda_{5m}$ through $\lambda_{8m}$ in FIG. 3 could originate from a second gain medium 10 and/or from a second laser cavities. The multiplexer 22 multiplexes the channels from both gain media to form a beam having channels $\lambda_{1m}$ through $\lambda_{8m}$. Alternately, the multiplexer 22 multiplexes the channels from different laser cavities to form a beam having channels $\lambda_{1m}$ through $\lambda_{8m}$. Additionally, more than one multiplexer can be employed to multiplex channels from different laser cavities. For instance, cascaded multiplexers can be employed to multiplex channels from different laser cavities. When one or more multiplexers the multiplexer 22 multiplexes the channels from different laser cavities, the different laser cavities and the one or more multiplexers can be included on the same multi-channel device.

Figure 4A:
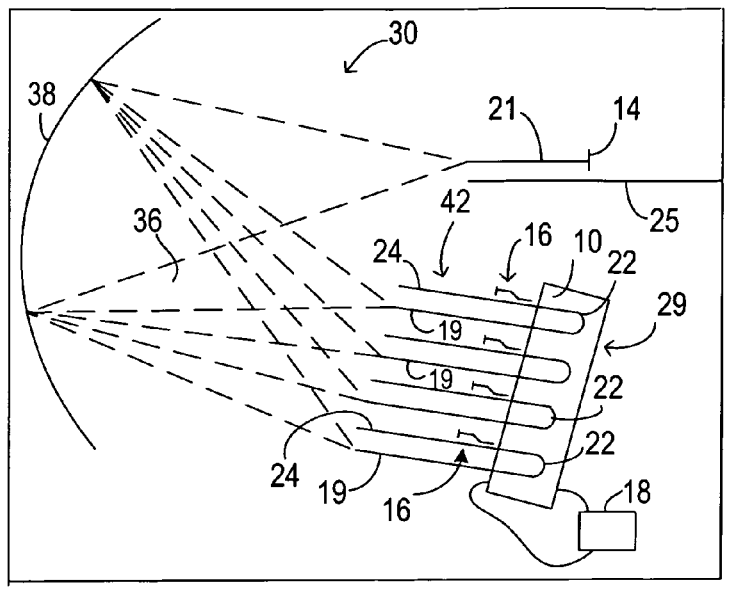
FIG. 4A and FIG. 4B illustrate a layout of a multi-channel device according to FIG. 1A.
Figure 4B:
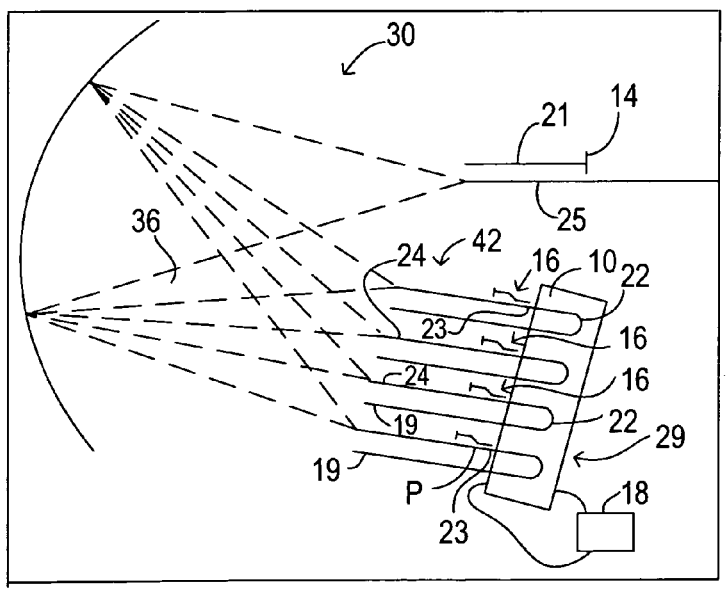

FIG. 4A and FIG. 4B illustrate a layout of a multi-channel device according to FIG. 1A. The dashed lines in FIG. 4A and FIG. 4B illustrate the path of light through the multi-channel device. While FIG. 4A and FIG. 4B show the same structures, the illustrated light paths are different in order to reduce the complexity of the image. For instance, the dashed lines in FIG. 4A show the path of light before the light exits from the laser cavities. In contrast, the dashed lines in FIG. 4B show the path of light after the light exits the laser cavities.

The illustrated multi-channel is suitable for use in conjunction with optical components. The multi-channel device employs a gain medium chip 29 that includes the gain medium 10 of FIG. 1A. The gain waveguides 22 are defined on the gain medium chip 29. The surfaces of the gain medium chip 29 through which the channel travel can optionally include an anti-reflective coating. The multi-channel device employs an electrical power source to pass an electrical current through the gain medium 10 and generate the light beam. The beam exits the gain medium 10 through the surface with the anti-reflective coating and enters cavity waveguides 19.

The multi-channel device of FIG. 4 employs an echelle grating 30 as the demultiplexer 12 of FIG. 1A. The echelle grating 30 includes a free space region 36 and a reflecting surface 38. The beams from the cavity waveguides 19 enter the free space region 36 of the echelle grating 30. The path of the light through the echelle grating 30 is illustrated as dashed lines in FIG. 4A in order to distinguish the light from other features of the multi-channel device. The beams travel through the free space region 36 and are reflected off of the reflecting surface 38. The reflecting surface is configured such that the beams converge as they travel toward a multiplexed signals waveguide 21. Accordingly, the reflecting surface multiplexes the beams. The multiplexed beams are each received at the multiplexed signals waveguide 21.

The multiplexed signals waveguide 21 terminates at the common reflector 14. The common reflector 14 reflects the multiplexed beams back into the multiplexed signals waveguide 21 that returns the multiplexed beams to the free space region 36 of the echelle grating 30. The multiplexed beams travel through the free space region 36 to the reflecting surface 38 and are reflected off of the reflecting surface 38. The details of the reflecting surface 38 are not shown in order to simplify the illustration. However, the reflecting surface 38 of an echelle grating 30 includes a plurality of stepped reflecting surfaces. The reflecting surface 38 causes light of different wavelengths to separate as they travel away from the reflecting surface 38. Accordingly, the echelle grating 30 demultiplexes the multiplexed beams into the individual channels traveling away from the reflecting surface 38. The channels are each received on a different one of the cavity waveguides 19.

Each of the cavity waveguides 19 guides one of the channels to gain waveguides 22 defined in the gain medium chip 29. The gain waveguides 22 each guide the received channel through the gain medium 10 to one of the second cavity waveguide 23. Each of the second cavity waveguides 23 guides one of the channels to one of the partial return device 16.

The multi-channel device of FIG. 4A and FIG. 4B employs an optical coupler 42 as the partial return device 16. Each coupler 42 couples a second cavity waveguide 23 with a coupled waveguide 44. The coupler 42 is constructed such that a portion of the channel traveling along a second cavity waveguides 23 is coupled into the associated coupled waveguide 44. The coupled waveguide 44 includes a reflecting device 46 that causes at least a portion of the channel to travel back along the coupled waveguide 44 into the second cavity waveguides 23 and back to the echelle grating 30 and accordingly back through the gain medium 10. A suitable reflecting device 46 includes, but is not limited to, a partially or completely reflecting surface at the end of the coupled waveguide 44.

The coupler 42 controls the portion of a channel returned to the gain medium chip 29 and accordingly to the gain medium 10. For instance, increasing the portion of a channel that is coupled into the coupled waveguide 44 can increase the portion of the channel returned to the gain medium 10. As a result, the couplers 42 should be configured to return enough of each channel to the gain medium 10 to achieve the desired level of lasing. The portion of a channel coupled into the coupled waveguide 44 can be controlled by changing the separation between a coupled waveguide 44 and the associated second cavity waveguides 23. For instance, reducing the distance between a coupled waveguide 44 and the associated second cavity waveguides 23 increases the portion of the channel that enters the coupled waveguide 44. In some instances, the portion of a channel coupled into the coupled waveguide 44 can also be controlled by changing the length for which the second cavity waveguides 23 and the coupled waveguide 44 are close enough to each share the channel. In some instances, increasing this length can increase the portion of the channel that is coupled into the coupled waveguide 44.

A portion of a channel traveling through a coupler 42 can be returned to the gain medium 10 as long as the channel is optically coupled into the coupled waveguide 44. The region of the second cavity waveguides 23 where a channel traveling along the second cavity waveguides 23 is no longer coupled into the coupled waveguide 44 serves as a port through which the channel exits the laser cavity and enters the associated channel waveguide 24. For instance, the lines labeled P in FIG. 4B can indicate where the channels exit the laser cavity through the port.

As is evident from FIG. 4B, the channel waveguides 24 each carry one of the channels that exit from one of the laser cavities to the free space region 36 of the echelle grating 30. The echelle grating 30 multiplexes the modulated channels into an output beam that contains each of the channels. The output waveguide 25 receives and guides the output beam.

Figure 5:
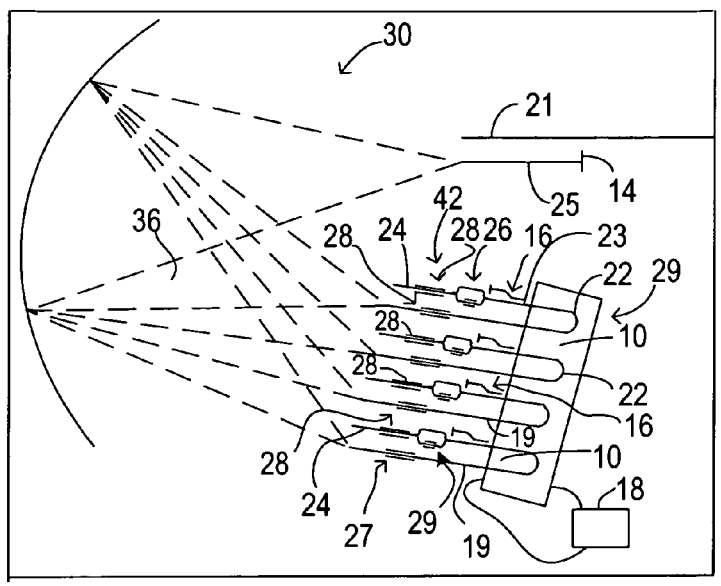
FIG. 5 illustrates a layout of a multi-channel device according to FIG. 2.

FIG. 5 illustrates a layout of a multi-channel device according to FIG. 2. The multi-channel device of FIG. 5 has the structure of the multi-channel shown in Figure but with a modulator positioned along each of the channel waveguides 24, an optical attenuator positioned along each of the cavity waveguides 19, and a light monitor positioned along each of the channel waveguides 24.

The multi-channel device of FIG. 5 employs a mach-zehnder interferometers 50 as the modulators 26 of FIG. 2. Each Mach-Zehnder interferometer 50 includes a first branch waveguide 52 and a second branch waveguide 53. A portion of a channel traveling along a channel waveguides 24 enters the first branch waveguide 52 and another portion of the channel enters the second branch waveguide 53. The first branch waveguide 52 and the second branch waveguide 53 join together again at another portion of the channel waveguide 24. Each of the second branch waveguides 53 includes a phase modulator 56. The phase modulator 56 can be employed to tune a phase differential between the portion of the channel in the first branch waveguide and the portion of the channel in the second branch waveguide when they are joined at the modulated waveguide 54. Accordingly, the mach-zehnder interferometer 50 can operate as an intensity modulator.

FIG. 5 illustrates an optical attenuator 27 positioned along each of the cavity waveguides 19. Accordingly, electronics can operate the optical attenuator to attenuate a channel traveling along a cavity waveguide 19. The optical attenuators are each positioned in one of the laser cavities. In some instances, the optical attenuators 27 can be positioned such that each optical attenuator is configured to attenuate the intensity of one of the channels. For instance, the optical attenuators are each positioned optically between the common reflector 14 and the partial return devices 16 for a channel to be attenuated by the optical attenuator. One or more of the optical attenuators can be tunable. In one example, all of the optical attenuators are tunable. As noted above, tunability of the optical attenuators permits balancing of the power of the different channels to compensate for loss or gain bias inside the laser cavities.

Suitable gain media for use in the multi-channel device include, but are not limited to, bulk semiconductor materials such as InP, InGaAsP, GaAs, and Silicon Based Amplifiers.

In some instances, the gain medium used in the multi-channel device is a quantum dot gain element or a quantum dot gain medium. Quantum dots are semiconductors, which are crystals of group II-VI, III-V, or IV-VI materials. However, quantum dots have a smaller size than bulk semiconductors. For instance, quantum dots can be about 2-10 nanometers in diameter or about 10-50 atoms in diameter. As a result, quantum dots have been called nanocrystals. Unlike bulk semiconductors, small changes to the size of quantum dot can change the wavelength of the photons released from the quantum dots. For instance, the addition or subtraction of one or two atoms to the quantum dot can change the wavelength of the photons released from the quantum dots. In contrast, the addition or subtraction of one or two atoms to bulk semiconductor materials does not alter the wavelength of the photons released from the bulk semiconductor material.

Quantum dots also tend to show quantum confinement which is absent from bulk semiconductor materials. Quantum confinement occurs when the size of a semiconductor material approaches that material's Exiton Bohr radius. At this size, the electron energy levels in the semiconductor can no longer be treated as continuous and are instead discrete energy levels.

The relationship between the size of a quantum dot and the wavelength of the photons released by the quantum dot allows for particular wavelengths to be achieved by using quantum dots of a particular size in the gain medium. Additionally, quantum dots constructed from different semiconductor materials can generate different wavelengths even when they are about the same size. These features allow quantum dots to produce photons having wavelengths that are outside the range of wavelengths that can normally be achieved with bulk semiconductor materials.

The gain element for a quantum dot laser generally includes a gain medium that includes quantum dots of different sizes and/or of different materials. For instance, one type of a quantum dot gain medium is constructed of multiple layers with different layers of material where each layer has quantum dots of a different size and/or material than the neighboring layer(s).

Figure 6A:
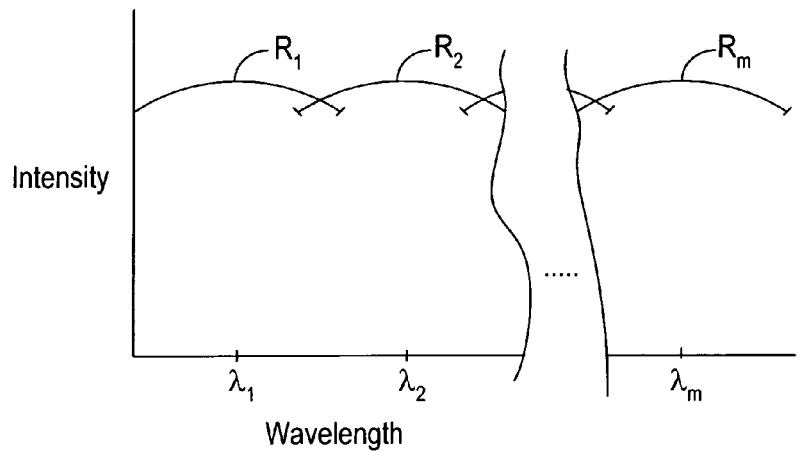
FIG. 6A is a possible intensity versus wavelength spectrum for the output of a quantum dot gain medium having quantum dots of radius R1, R2, . . . Rm.

The presence of quantum dots having different sizes and/or materials in the gain element causes the gain element to concurrently produce light signals of different wavelengths. For instance, FIG. 6A illustrates a possible intensity versus wavelength spectrum for the output of a quantum dot gain medium having quantum dots of radius $R1, R2, \ldots Rm$. As is evident from FIG. 6A, each size of quantum dot is associated with a gain peak at a particular wavelength.

FIG. 6A illustrates each gain peak having about the same intensity. The intensities of different peaks relative to one another can be adjusted by adjusting the relative amounts of the quantum dots that are responsible for each gain peak in the gain medium.

Figure 6B:
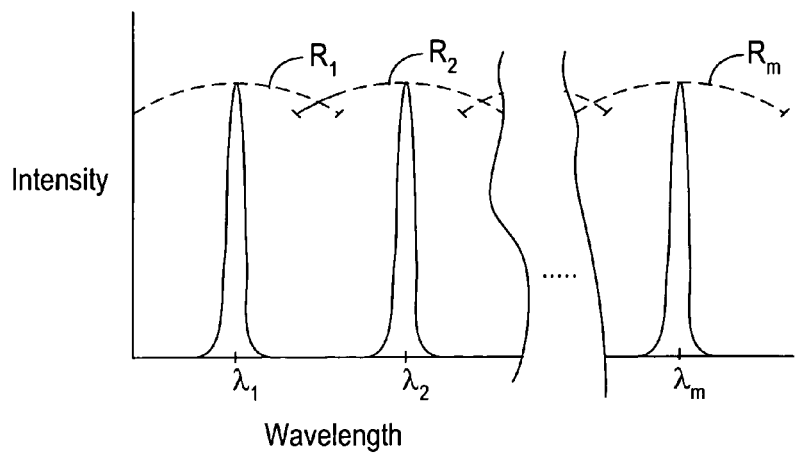
FIG. 6B is an intensity versus wavelength spectrum for a laser having a multiplexer in the laser cavity when the gain medium is a quantum dot gain medium that results in an intensity versus wavelength spectrum according to FIG. 6A.

The presence of the demultiplexer in the laser cavities suppresses the lasing of particular wavelengths and accordingly controls the wavelengths that are output from the laser cavities. For instance, when the wavelengths selected by the demultiplexer are matched to the gain peaks of the gain medium, the output of the laser cavities can have an intensity versus wavelength spectrum according to FIG. 6B. In FIG. 6B, the dashed lines represent the gain peaks that would occur in the absence of a demultiplexer in the laser cavities.

Figure 6C:
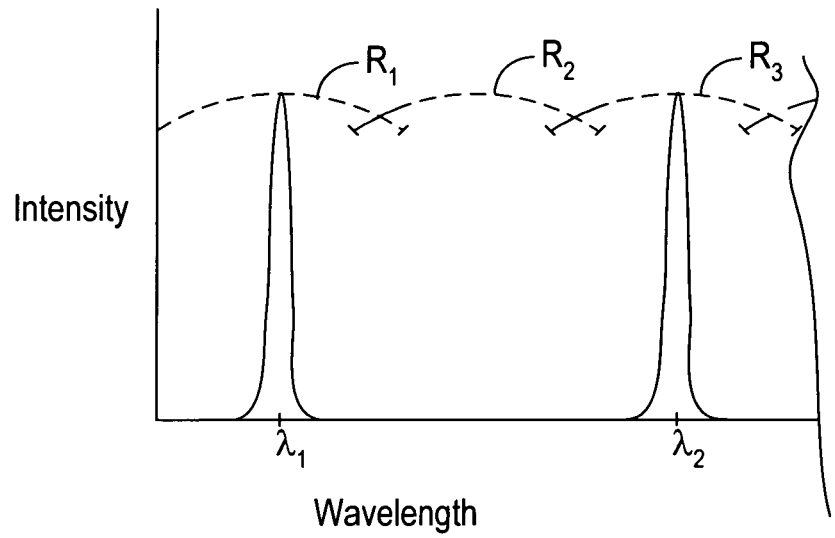
FIG. 6C is an intensity versus wavelength spectrum for a laser having a multiplexer in the laser cavity when the gain medium is a quantum dot gain medium that results in an intensity versus wavelength spectrum according to FIG. 6A. Quantum dots having radius $R_2$ are not the dominant source of the light for any of the channels output from the laser cavity.

Since the demultiplexer in the laser cavities selects the wavelengths of the channels output by the laser cavities, each of the gain peaks is not necessarily associated with a channel. For instance, FIG. 6C shows an intensity versus wavelength spectrum where one of the gain peaks does not result in a channel being output from the laser cavities. The quantum dots having radius $R_2$ are not the dominant source of the light for any of the channels output from the laser cavities. In FIG. 6C, the dashed lines represent the gain peaks that would occur in the absence of a demultiplexer in the laser cavities. This arrangement allows the separation between the channels to be increased above the separation that is provided by the gain medium itself. For instance, the current separation is about 0.2 nm. The use of the demultiplexer in the laser cavities allows this separation to be increased without reducing the power of the output. Additionally, the increased separation can increase the thermal and wavelength stability of the device.

Figure 6D:
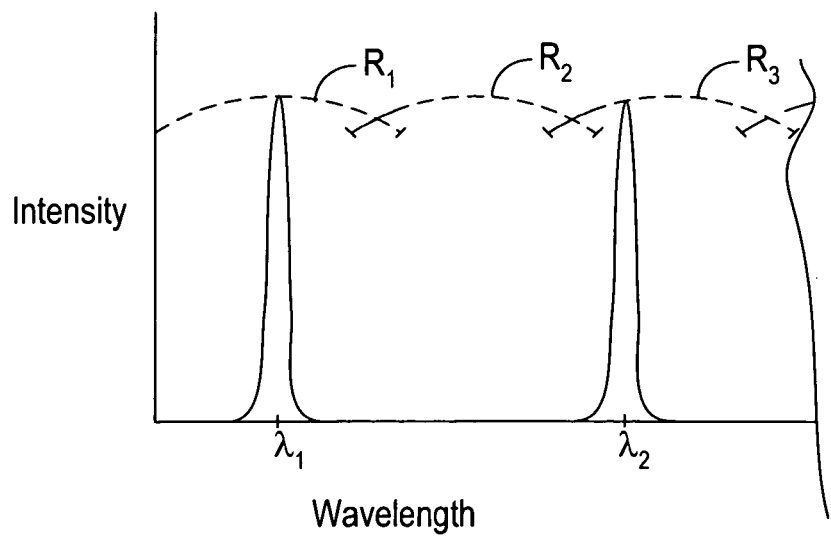
FIG. 6D is an intensity versus wavelength spectrum for a laser having a multiplexer in the laser cavity when the gain medium is a quantum dot gain medium that results in an intensity versus wavelength spectrum according to FIG. 6A. The channel $\lambda_2$ has a wavelength that is not located at the peak of the gain spectrum associated with quantum dots having radius $R_3$

Since the demultiplexer selects the wavelength of the channels, in some instances, all or a portion of the channels are at a wavelength that does not correspond to the wavelength of a gain peak. For instance, FIG. 6D shows an intensity versus wavelength spectrum where the channel $\lambda_2$ has a wavelength that is not located at the peak of the gain spectrum associated with quantum dots having radius $R_3$. In contrast, the channel $\lambda_1$ has a wavelength located at the peak of the gain spectrum associated with quantum dots having radius $R_1$. If each of the gain peaks is at about the same intensity, this arrangement can cause channel $\lambda_1$ to have more intensity than channel $\lambda_2$. In the event that this is undesirable, the gain medium can be constructed such that the gain peak for associated with quantum dots having radius $R_3$ is at an increased intensity in order to increase the intensity of the channel $\lambda_2$. Additionally or alternately, the attenuators 23 can be employed to balance the intensity of the different channels to the desired levels.

Although FIG. 6D illustrates the wavelengths of the gain peaks as being periodic, this arrangement is not necessary and the wavelengths of the gain peaks may be non-periodic.

FIG. 6B through FIG. 6D shows that each gain peak that results in a channel being produced by the laser cavities results in only one channel being produced by the laser cavities. However, the demultiplexer in the laser cavities can optionally be configured such that one or more gain peaks each results more than one channel being produced by the laser cavities. However, it is preferred that each gain peak that results in a channel being produced by the laser cavities results in only one channel being produced by the laser cavities in order to reduce competition between the channels.

Additional information about the use of a quantum dot gain medium in laser cavities that includes a multiplexer is disclosed in U.S. patent application Ser. No. 12/800,047, filed on May 6, 2010, entitled "Multi-Channel Optical Device," and incorporated herein in its entirety.

The multi-channel device of FIG. 4 and FIG. 5 can be built into a variety of optical component platforms. Suitable optical component platforms include, but are not limited to, a silicon-on-insulator platform. FIG. 7A through FIG. 12B illustrate various components of the multi-channel device illustrated in FIG. 1A through FIG. 5 constructed on a silicon-on-insulator platform. Accordingly, the components illustrated in 6A through FIG. 12B can be arranged on a silicon-on-insulator according to 6A through FIG. 12B. As a result, the components illustrated in 6A through FIG. 12B can be combined so as to form a multi-channel device.

Figure 7D:
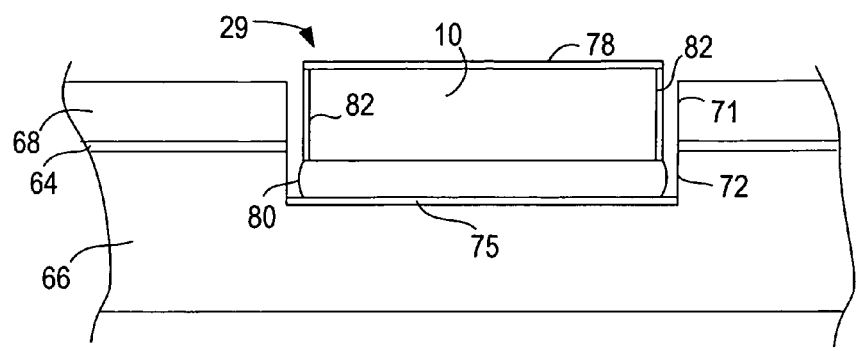

FIG. 7A through FIG. 7D illustrate a portion of a multi-channel device having an interface between a cavity waveguide 19 and a gain medium chip 29. The multi-channel device is constructed on a silicon-on-insulator wafer. FIG. 7A is a topview of the multi-channel device. FIG. 7B is a cross section of the multi-channel device shown in FIG. 7A taken along the line labeled B. The line labeled B extends through the cavity waveguide 19 disclosed in FIG. 7A. Accordingly, FIG. 7B is a cross section of the cavity waveguide 19. The silicon-on-insulator wafer includes a silica layer 64 between a silicon substrate 66 and a silicon slab 68. Trenches 70 in the silicon slab 68 define a ridge 72. The ridge 72 and the silica layer 64 define a light signal-carrying region where the light beam is constrained. For instance, the reduced index of refraction of the silica relative to the silicon prevents the light beam from entering the substrate from the silicon. The other waveguides on the multi-channel device have a structure similar to the structure shown in FIG. 7B although they can have different dimensions. For instance, the cavity waveguides 19, second cavity waveguides 23, the channel waveguides 24, and any output waveguide 25 can each have a structure as illustrated in FIG. 7B.

FIG. 7C is a cross section of the multi-channel device shown in FIG. 7A taken along a line extending between the brackets labeled C in FIG. 7A. FIG. 7D is a cross section of the multi-channel device shown in FIG. 7A taken along a line extending between the brackets labeled D in FIG. 7A. A first recess 71 extends into through the silicon slab 68 and the silica layer 64. A second recess 72 extends into the bottom of the first recess 71 such that the silicon substrate 66 forms shelves 73 in the bottom of the second recess 72. A first conducting layer 75 is positioned in the bottom of the second recess 72. A first conductor 76 on the silicon slab 68 is in electrical communication with the first conducting layer 75. A second conductor 77 on the silicon slab 68 is positioned adjacent to the first recess 71.

The gain medium chip 29 is positioned in the first recess 71 and rests on the shelves 73. The gain medium chip 29 includes a gain medium 10. Suitable materials for the gain medium 10 include, but are not limited to, an InP layer. A second conducting layer 78 is positioned on the gain medium 10. A third conductor 79 provides electrical communication between the second conducting layer 78 and the second conductor 77.

Three ridges extending into the second recess 72. The outer-most ridges have a passivation layer. The central ridge is in electrical communication with the first conducting layer 75. The electrical communication between the central ridge and the first conductor 76 can be achieved through a conducting medium 80 such as solder. Since the first conductor 76 is in electrical communication with the first conducting layer 75, the first conductor 76 is in electrical communication with the central ridge. The central ridge serves as the gain waveguide 22.

The beam of light can be generated from the gain medium 10 by causing an electrical current to flow through the gain medium 10. The electrical current can be generated by electronics (not shown) that apply a potential difference between the first conductor 76 and the second conductor 77. The potential difference can be provided by the power source 18 illustrated in FIG. 2. The power source 18 can be included on the multi-channel device or can be separate from the multi-channel device and the multi-channel device can be configured to be electrically coupled with the power source 18.

The sides of the gain medium 10 through which light signals and/or channels enter and/or exit the gain medium 10 have an anti-reflective coating 82. The beam of light exits and enters the gain medium 10 through the anti-reflective coating 82.

As is evident from FIG. 7A, the facet 81 for the cavity waveguide 19 and the second cavity waveguide 23 can be angled at less than ninety degrees relative to the direction of propagation in the waveguide. Angling the facet 81 at less than ninety degrees can cause light signals reflected at the facet 81 to be reflected out of the waveguide and can accordingly reduce issues associated with back reflection.

The trenches 70 for the waveguides can be formed using traditional integrated circuit manufacturing masking and etching steps. The first recess 71 can be formed in a different mask and etch. Further, the second recess 72 can be formed in another mask and etch steps. The first conducting layer 75, the first conductor 76, and the second conductor 77 can be formed using traditional integrated circuit manufacturing techniques for forming metal traces on substrates.

Suitable gain medium chips 29 include, but are not limited to, InP chips. The electrical communication between the second conducting layer 78 and the second conductor 77 can be achieved using traditional techniques such as wire bonding. The electrical communication between the central ridge and the first conductor 76 can be achieved through traditional techniques such as solder bonding.

The portion of the multi-channel device illustrated in FIG. 7A through FIG. 7D is suitable for use with an electrical power source, however, the illustrations in FIG. 7A through FIG. 7D can be adapted for use with a light source that serves as a power source. The light source can be included on the multi-channel device or can be separate from the multi-channel device.

Although FIG. 7A through FIG. 7D illustrate a gain medium that receives and/or generates multiple channels, the gain medium of FIG. 7A through FIG. 7D can be adapted for receipt and receipt of a single channel for use as the gain media of FIG. 1B.

Figure 8A:
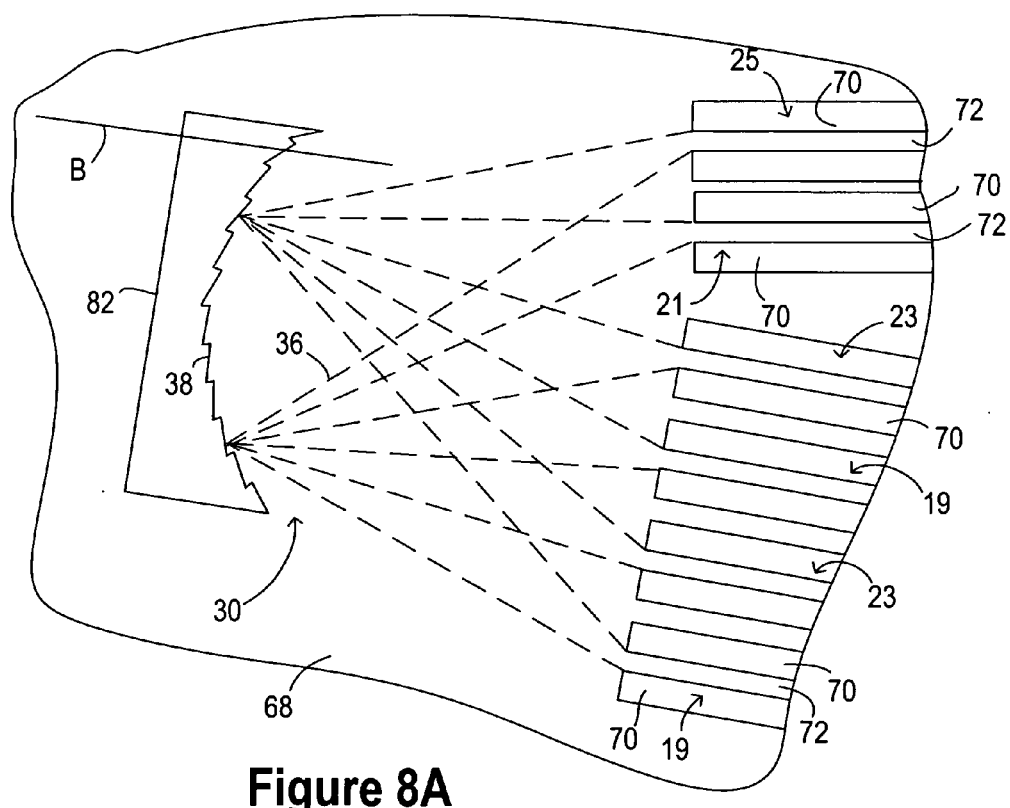
FIG. 8A and FIG. 8B illustrate a portion of a multi-channel device having an interface between an echelle grating, a cavity waveguide, and channel waveguides.
Figure 8B:
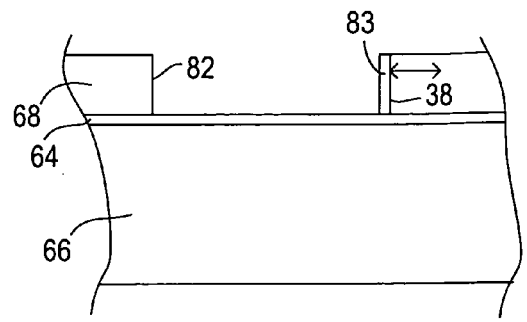

FIG. 8A and FIG. 8B illustrate a portion of a multi-channel device having an interface between an echelle grating 30, cavity waveguides 19, second cavity waveguides 23, multiplexed signals waveguide 21, and an output waveguide 25. In order to simplify the illustration of FIG. 8A, the multi-channel device is shown for generating two channels. The multi-channel device of FIG. 8A can be scaled up to include additional channels.

The multi-channel device of FIG. 8A and FIG. 8B is formed on a silicon-on-insulator wafer. FIG. 8A is a topview of the silicon-on-insulator wafer. FIG. 8B is a cross section taken along the line labeled B in FIG. 8A. As is evident from FIG. 4A through FIG. 5, the echelle grating 30 includes a free space region 36 and a reflecting surface 38. The beam from the cavity waveguide 19 enters the free space region 36 of the echelle grating 30. The path of the light through the echelle grating 30 is illustrated as dashed lines in FIG. 8A in order to distinguish the light from structural features. The beam travels through the free space region 36 and is reflected off of the reflecting surface 38. The echelle grating 30 demultiplexes/multiplexes the beam into the individual channels traveling away from the reflecting surface 38.

A reflecting recess 81 extends through the silicon slab 68 to the silica layer 64 and can extend to into or through the silica layer 64. A side of the reflecting recess 81 serves as the reflecting surface 38. The side of the reflecting recess 81 can optionally include a reflecting material 83 to enhance reflection of light from the free space region 36. Suitable reflecting materials 83 include a layer of metal. The reflecting recess 81 can be filled with air or can optionally be filled with a cladding material such as silica.

The cavity waveguides 19, second cavity waveguides 23, multiplexed signals waveguide 21, and an output waveguide 25 shown in FIG. 8A have the same general structure as the waveguide shown in FIG. 7B. For instance, the cavity waveguides 19, second cavity waveguides 23, multiplexed signals waveguide 21, and an output waveguide 25 can have the cross section illustrated in FIG. 7B. As is evident in FIG. 8A, an end of the cavity waveguides 19, second cavity waveguides 23, multiplexed signals waveguide 21, and an output waveguide 25 do not terminate at a facet but instead open up into the free space 36 region of the echelle grating 30.

In some instances, the trenches 70 for the cavity waveguides 19, second cavity waveguides 23, multiplexed signals waveguide 21, and an output waveguide 25 are formed concurrently. The reflecting recess 81 can optionally be masked and etched concurrently with the first recess 71 for the gain medium chip 29 or can be masked and etched in a different step. The reflecting material 83 can be formed in the reflector recess 84 using traditional integrated circuit manufacturing techniques.

Other suitable echelle grating structures and/or methods of echelle grating fabrication are disclosed in U.S. patent application Ser. No. 12/800,600, filed on May 18, 2010, and entitled "Extension of Steps in Reflective Optical Gratings," and also in U.S. Provisional Patent Application Ser. No. 61/284,723, filed on Dec. 23, 2009, and entitled "Reducing Optical Loss in Reflective Optical Gratings," and also in U.S. Provisional patent application Ser. No. 12/321,386, filed on Jan. 16, 2009, and entitled "Optical Component Having Features Extending Different Depths into a Light Transmitting Medium," each of which is incorporated herein in its entirety. The echelle grating structures and/or methods of echelle grating fabrication disclosed in these patent applications can be employed in a multi-channel device constructed according to FIG. 1A through FIG. 5.

Figure 9A:
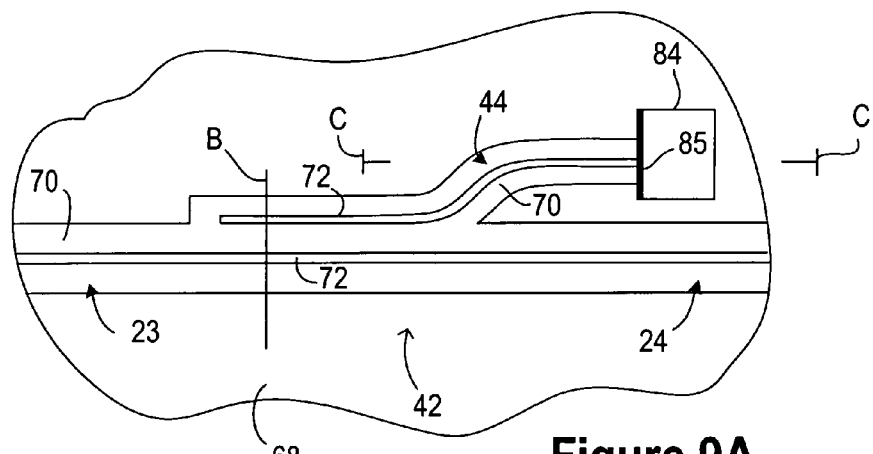
FIG. 9A through FIG. 9C illustrate a portion of a multi-channel device having an optical coupler.
Figure 9B:
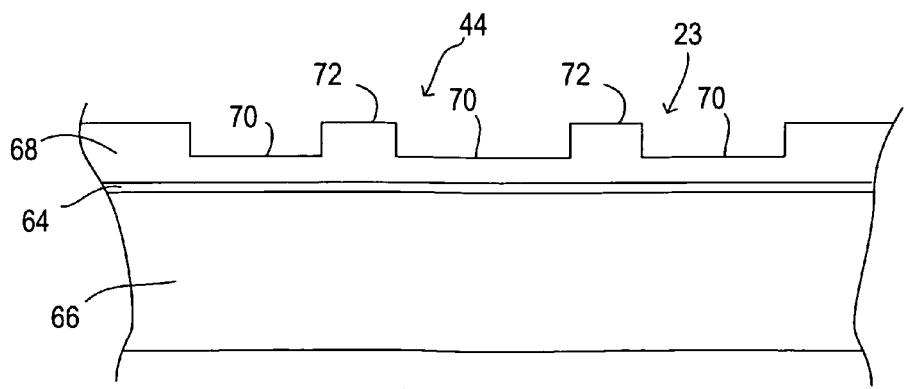
Figure 9C:
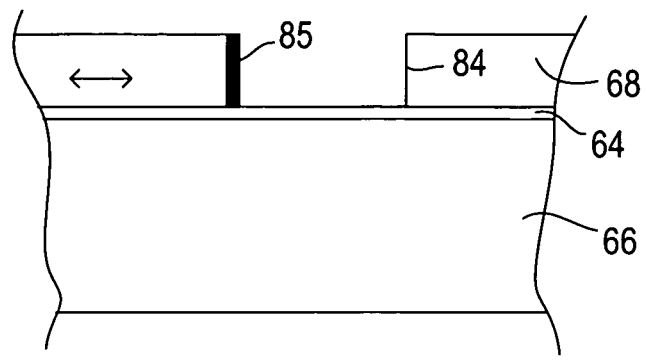

FIG. 9A through FIG. 9C illustrate the portion of a multi-channel device having an optical coupler 42 that can serve as a partial return device 16. The multi-channel device is constructed on a silicon-on-insulator wafer. In some instances, each of the optical couplers 42 illustrated in FIG. 1A through FIG. 4 are constructed according to FIG. 9A through FIG. 9C. FIG. 9A is a topview of the multi-channel device. The coupler 42 includes a multiplexed signals waveguide 21 and a coupled waveguide 44. FIG. 9B is a cross section of the coupled waveguide and the multiplexed signals waveguide 21 taken along the line labeled B in FIG. 9A. The ridge 72 for the coupled waveguide 44 is close enough to the ridge 72 for the multiplexed signals waveguide 21 for the multiplexed signals waveguide 21 and the coupled waveguide 44 to physically share a channel as it travels along the multiplexed signals waveguide 21. Accordingly, a portion of the channel transfers into the coupled waveguide 44 before the ridge 72 of the coupled waveguide 44 and the ridge 72 of the multiplexed signals waveguide 21 physically separate as shown in FIG. 9A.

FIG. 9C is a cross section of the coupled waveguide 44 taken along a line between the brackets labeled C in FIG. 9A. The coupled waveguide 44 terminates at a reflector recess extending through the silicon slab 68 to or into the silica layer 64. A side of the reflector recess 84 serves as a reflecting surface. The reflecting surface serves as the reflecting device 46 disclosed in the context of FIG. 4A through FIG. 5. The side of the reflector recess 84 can optionally include a reflecting material 85 to enhance reflection of light back through the coupled waveguide 44. Suitable reflecting materials 85 include a layer of metal. The reflector recess 84 can be filled with air or can optionally be filled with a cladding material such as silica.

The trenches 70 for the second cavity waveguide 23 and the coupled waveguides 44 can be formed concurrently with the trenches 70 for the cavity waveguide 19. The reflector recess 84 can optionally be masked and etched concurrently with the first recess 71 for the gain medium chip 29 and/or with the reflecting recess 81 for the echelle grating 30. Alternately, the reflector recess 84 can be masked and etched in a different step. The reflecting material 85 can be formed in the reflector recess 84 using traditional integrated circuit manufacturing techniques.

Figure 10A:
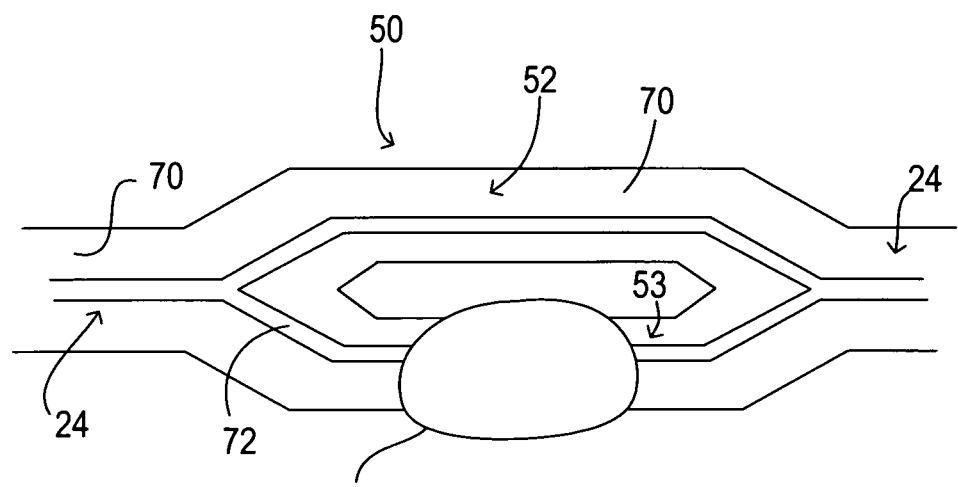
FIG. 10A through FIG. 10E illustrate a portion of a multi-channel device having a mach-zehnder interferometer configured to operate as an intensity modulator.

FIG. 10A through FIG. 10E illustrate a portion of a multi-channel device having a mach-zehnder interferometer configured to operate as an intensity modulator. The multi-channel device is constructed on a silicon-on-insulator wafer. FIG. 10A is a topview of the mach-zehnder interferometer. The mach-zehnder interferometer includes a cavity waveguide 23 that branches into a first branch waveguide 52 and a second branch waveguide 53. The first branch waveguide 52 re-joins the second branch waveguide 53 at the cavity waveguide 23.

The cavity waveguide 23, the first branch waveguide 52, the second branch waveguide 53 have the same general structure as the waveguide shown in FIG. 7B. For instance, the cavity waveguide 23, the first branch waveguide 52, and the second branch waveguide 53 can have the cross section illustrated in FIG. 7B. The trenches 70 for the cavity waveguide 23, the first branch waveguide 52, and/or the second branch waveguide 53 can be masked and etched concurrently.

Figure 10B:
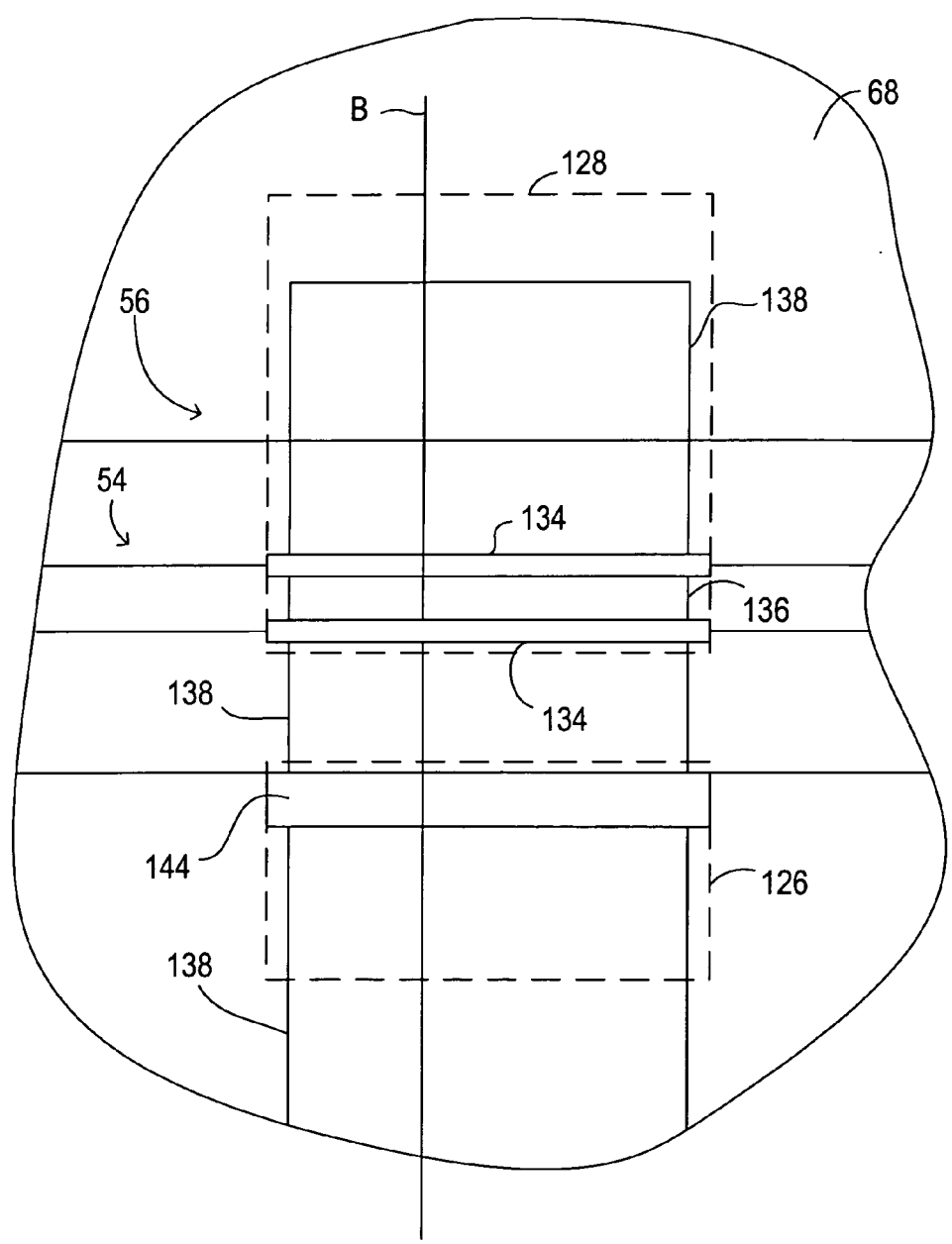
Figure 10C:
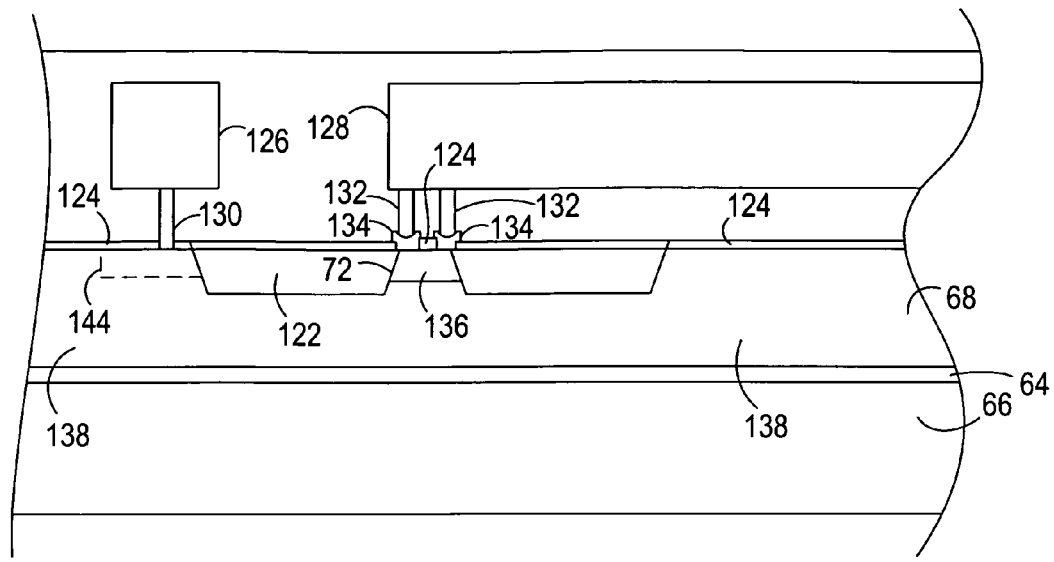

A phase modulator 56 is positioned along the second branch waveguide 53. FIG. 10B is a topview of a phase modulator 56 that is suitable for use with the mach-zehnder interferometer of FIG. 10A. FIG. 10C is a cross section of the phase modulator 56 shown in FIG. 10B taken along the line labeled C in FIG. 10B. A filler 122 such as a solid or a gas is positioned in the trenches 70 that define the second branch waveguide 53. The filler 122 has an index of refraction lower than the index of refraction of the silicon in order to constrain the light signals within the ridge 72. The filler can also provide electrical isolation between different regions of the phase modulator. For instance, the filler can provide electrical isolation between the first doped region and the second doped region, which are discussed in more detail below. A suitable filler 122 includes, but is not limited to, silica. A vacuum can also serve as a suitable filler 122.

An insulating layer 124 is positioned on the silicon slab 68 and the filler 122. The insulating layer 124 is illustrated in FIG. 10C but is not illustrated in FIG. 10B to simplify the illustration. The insulating layer 124 can provide electrical insulation and/or optical confinement. A suitable insulating layer 124 includes, but is not limited to, low K dielectrics such as silica, and/or silicon nitride. In one example, the insulating layer 124 includes a silicon nitride and oxide bi-layer over silicon.

An upper layer 125 is positioned on the insulating layer 124. The upper layer 125 is illustrated in FIG. 10C but is not illustrated in FIG. 10B to simplify the illustration. The upper layer 125 can serve to reduce or prevent capacitive coupling between different components in the device. For instance, the upper layer 125 can prevent or reduce capacitive coupling between a first conducting member 126 and a second conducting member 128 that are disclosed in more detail below. A suitable upper layer includes, but is not limited to, low K dielectrics such as silica.

The phase modulator includes a first conducting member 126 and a second conducting member 128 as is evident in both FIG. 10B and FIG. 10C. In FIG. 10B, the first conducting member 126 and the second conducting member 128 are illustrated by dashed lines and are shown as transparent to permit a view of the underlying features. The first conducting member 126 and the second conducting member 128 can serve as electrodes but more preferably serve as transmission lines. Suitable materials for the first conducting member 126 include, but are not limited to, aluminum, copper and/or their alloys. Suitable materials for the second conducting member 128 include, but are not limited to, aluminum, copper and/or their alloys.

A first electrical connector 130 provides electrical communication between the first member 126 and a contact portion of the silicon slab 68 located adjacent to the waveguide and spaced apart from the waveguide. Second electrical connectors 132 provide electrical communication between contacts 134 at the top of the ridge 72 and the second member 128. The first electrical connector 130 and the second electrical connectors 132 are illustrated in FIG. 10C but are not illustrated in FIG. 10B to simplify the illustration. The first electrical connectors, the second electrical connectors and the contacts provide electrical connections between electronics and the optics. Suitable materials for the first electrical connector 130 include, but are not limited to, tungsten, aluminum, copper and/or their alloys. Suitable materials for the second electrical connector 132 include, but are not limited to, tungsten, aluminum, copper and/or their alloys. Suitable materials for the contacts 134 include, but are not limited to, Al—Si alloys, Ti silicide, and Co silicide.

In some instances, the contacts 134 are a doped non-metal such as doped silicon or doped polysilicon. Doped polysilicon can provide the required electrical conduction but can have about two orders of magnitude fewer carriers than the metal. Because increased carrier content is associated with increased light absorption, contacts 134 constructed from doped silicon can be associated with reduced levels of optical loss relative to metals. As a result, contacts 134 constructed of doped silicon or polysilicon may be desired when low levels of optical loss are desired. When the contacts 134 are made of polysilicon, a suitable concentration of the dopant includes, but is not limited to, concentrations of about $10^{18}/cm^3$ to $2 \times 10^{21}/cm^3$ or $10^{19}/cm^3$ to $2 \times 10^{20}/cm^3$.

The silicon is doped so as to have a first doped region 136 and a second doped region 138. When the first doped region 136 is an n-type region, the second dope region 138 is a p-type region. When the first doped region 136 is a p-type region, the second dope region 138 is an n-type region. In some instances, the first doped region is preferably an n-type region and the second doped region is preferably a p-type region. For instance, certain fabrication techniques may permit easier formation of a p-type region deeper in the light transmitting medium that an n-type region. When the contacts 134 are formed of a doped non-metal, the non-metal is doped with the same type of dopant as the first doped region 136 but can be at a higher dopant concentration than the first doped region 136.

The first doped region 136 and the second doped region 138 are positioned sufficiently close to one another that a depletion region 140 forms between the n-type region and the p-type region when a bias is not applied to the phase modulator. For instance, FIG. 10C illustrates the n-type region in contact with the p-type region. Contact between the n-type region and the p-type region may not be necessary although it can increase the efficiency of the modulator. The resulting interface is substantially parallel to the top of the ridge 72 and/or the silicon substrate 66 and is positioned in the ridge 72.

The depletion region 140 results from a migration of carriers between the n-type region and the p-type region until a potential forms that prevents additional migration. This migration results in a lack of carriers in the depletion region. For instance, the depletion region 140 has a carrier concentration of less than about $1 \times 10^{15}/cm^3$. The n-type region and a p-type region are positioned so the depletion region 140 is positioned in the light signal-carrying region of the waveguide. For instance, FIG. 10C illustrates the depletion region 140 that forms from the doped region configuration illustrated in FIG. 10B. A suitable concentration of carriers in the p-type region includes values greater than $1 \times 10^{15}/cm^3$, $1 \times 10^{16}/cm^3$, $3.5 \times 10^{16}/cm^3$, or $5.0 \times 10^{17}/cm^3$. A suitable value for the concentration of carriers in the n-type region includes values greater than $1 \times 10^{15}/cm^3$, $2 \times 10^{16}$, $5 \times 10^{16}$, and $1 \times 10^{18}$ $cm^{-3}$.

A secondary doped region 144 is formed at the contact portion of the silicon slab 68. The secondary doped region 144 can contact the adjacent doped region and can include the same type of dopant as the adjacent doped region. For instance, in FIG. 10C, the underlying doped region is the second doped region 138. Accordingly, when the phase modulator is constructed as illustrated in FIG. 10C, the secondary doped region 144 can contact the second doped region and has a dopant type that is the same as the second doped region 138. The secondary doped region 144 can have a higher dopant concentration than the adjacent doped region. For instance, the dopant concentration in the secondary doped region 144 can be more than 10 times the dopant concentration in the adjacent doped region or more than 1000 times the dopant concentration in the adjacent doped region. The elevated dopant concentration reduces the contact resistance of the phase modulator and accordingly provides an increased modulation speed. Suitable concentrations for the dopant in the secondary doped region 144 include, but are not limited to, concentrations greater than $1 \times 10^{18}/cm^3$, $1 \times 10^{19}/cm^3$, $5 \times 10^{19}/cm^3$, $1 \times 10^{20}/cm^3$. Increasing the dopant concentration can increase the amount of optical loss. As a result, the secondary doped region 144 is positioned remote from the light signal-carrying region in order to reduce optical loss resulting from the increased dopant concentration. For instance, the secondary doped region 144 is positioned on a portion of the silicon slab 68 adjacent to the trench 70. This location can reduce interaction between a light signal in the waveguide and the secondary doped region 144. In some instances, the secondary doped region 144 can be positioned in the trench 70 or in the bottom of the trench 70.

Figure 10D:
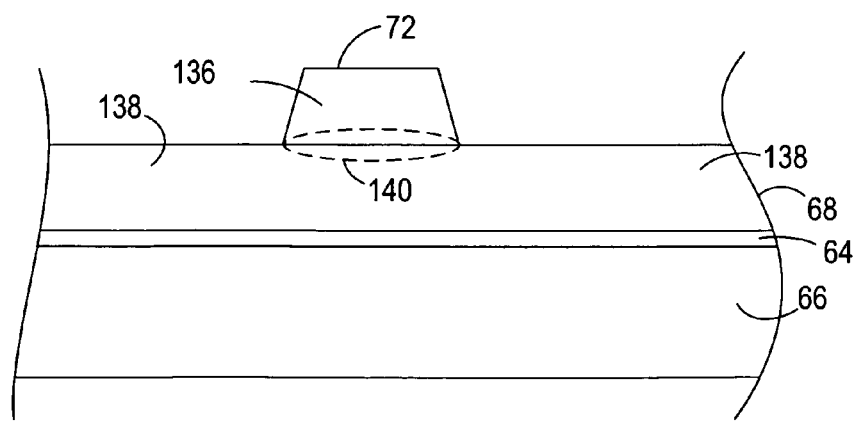
Figure 10E:
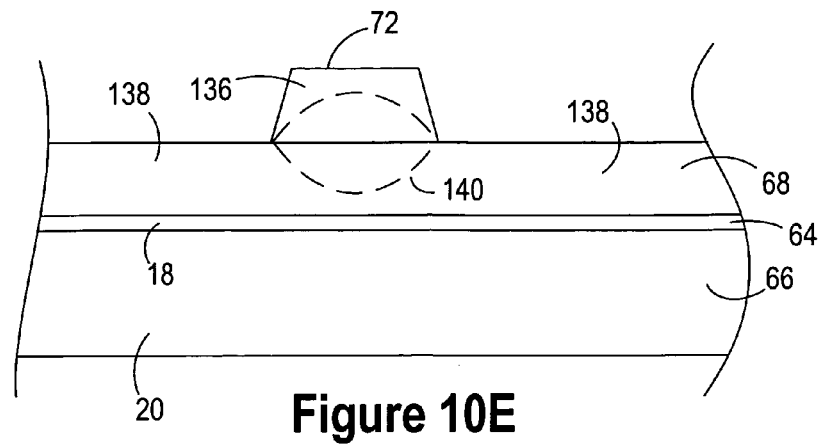

The first member 126 and the second member 128 are connected to the electronics (not shown). The electronics can apply a bias between the first conducting member 126 and the second conducting member 128. Accordingly, a bias is formed between the top of the ridge 72 and the contact portion of the silicon slab 68. The bias can be a reverse bias. Changing the level of bias changes the size and/or shape of the depletion region. For instance, increasing the reverse bias can increase the size of the depletion region. As an example, FIG. 10E illustrates the depletion region of FIG. 10D after an increased reverse bias has been applied to the phase modulator. FIG. 10C, FIG. 10D and FIG. 10E illustrate the first doped region and the second doped region occupying the entire light signal carrying region. This arrangement can provide an increased potential tuning efficiency.

The depletion region 140 has a different index of refraction than the light transmitting region located adjacent to the depletion region. For instance, when the light-transmitting medium 110 is silicon, the depletion region 140 has a higher index of refraction than that of the surrounding silicon. As a result, the depletion region 140 slows the light signal as the light signal travels through the depletion region. As a result, increasing the size of the depletion region 140 further slows the speed at which the light signal travels through the waveguide. Accordingly, the speed of the light signal through the waveguide can be tuned by tuning the bias level. Additionally, because this phase tuning is based on tuning of the depletion region, tuning of the phase modulator does not involve carrier re-combination. Carrier recombination is on the order of 1000 times slower than changes in the depletion region. Accordingly, the phase modulator can be on the order of 1000 to 10000 times faster than phase modulators that require carrier recombination.

A forward bias can be applied to the phase modulator. The forward bias will shrink the size of the depletion region. Accordingly, increasing the forward bias can accelerate the light signal. However, once the forward bias rises above a threshold, the forward bias can result in current flow that requires recombination as the forward bias drops toward the threshold. Because tuning that requires recombination is slower than tuning of the depletion region, it may not be desirable to use the forward bias above levels where significant current flow occurs.

The concentration of the dopants in the doped regions influences the performance of the phase modulator. For instance, the dopants can cause light absorption. As a result, increasing the dopant level can cause undesirably high levels of optical loss. Decreasing the dopant level can reduce the tuning efficiency by requiring a higher bias level to achieve the same level of phase modulation. As a result, when the dopant level is reduced, the length of the phase modulator must be increased to provide the desired level of phase modulation for a given bias level. Suitable dopants for the n-type region include, but are not limited to, phosphorus and/or arsenic. Suitable dopants for the p-type regions include, but are not limited to, boron.

Although FIG. 10C illustrates the interface between the first doped region 136 and the second doped region 138 as being positioned in the ridge 72, first doped region 136 and the second doped region 138 can be constructed so the interface is below the ridge 72. In these instances, the doped region in the ridge 72 and the secondary doped region 144 may be the same type of doped region. For instance, the doped region in the ridge 72 and the secondary doped region 144 may both be an n-type region or they may both be a p-type region.

In some instances, it is desirable for an intensity modulator such as a Mach-Zehnder interferometer to provide intensity modulation on the order of 10 to 40 Gbit/s with low levels of optical loss. Accordingly, the high-speed features of the phase modulator can be important when the phase modulator is employed for intensity modulation. Additionally, the low optical loss features of the phase modulator can also become desirable when the phase modulator is employed for intensity modulation.

Figure 10F:
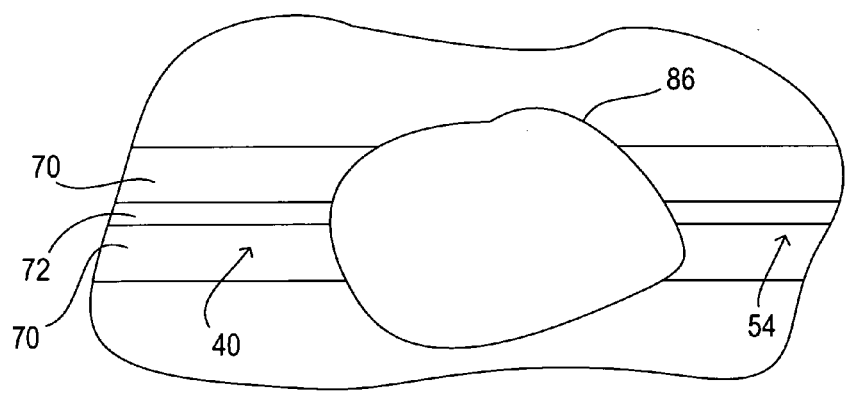
FIG. 10F illustrates the phase modulator of FIG. 10B through FIG. 10E substituted for the intensity modulator illustrated in FIG. 10A.

In some instances, it may be preferable for the modulator to be a phase modulator rather than an intensity modulator. For instance, FIG. 10F illustrates the phase modulator of FIG. 10B through FIG. 10E substituted for the intensity modulator illustrated in FIG. 10A. In FIG. 10F, the first branch waveguide 52 and the second branch waveguide 53 are eliminated and the multiplexed signals waveguide 21 is connected directly to the modulated waveguide 54. The phase modulator is positioned at the intersection of the multiplexed signals waveguide 21 and the modulated waveguide 54.

Additional information regarding the structure, fabrication, and operation of a high speed intensity modulator are provided in U.S. patent application Ser. No. 11/146,898, filed on Jun. 7, 2005, entitled "High Speed Optical Phase Modulator" and in U.S. patent application Ser. No. 11/147,403, filed on Jun. 7, 2005, entitled "High Speed Optical Intensity Modulator," each of which is incorporated herein in its entirety. Additionally, U.S. patent application Ser. Nos. 11/146,898 and 11/147,403 provide additional embodiments for phase and intensity modulators that can be employed as modulators in the multi-channel device disclosed above.

The filler 122, the upper layer 125, and the insulating layer 124 that are present in FIG. 10C are not shown in FIG. 10A through FIG. 10C. The filler 122, the upper layer 125, and the insulating layer 124 can be localized to the modulator. Alternately, the upper layer 125 and the insulating layer 124 can be positioned on the exposed silicon slab 68 and the filler 122 can be positioned in the trenches 70 of FIG. 10A through FIG. 10C.

Suitable structures for the attenuator and/or methods of attenuator fabrication are disclosed in U.S. patent application Ser. No. 08/617,810, filed on Mar. 20, 1996, entitled "Integrated Silicon PIN Diode Electro-Optic Waveguide" issued as U.S. Pat. No. 5,757,986, and also in U.S. patent application Ser. No. 09/083,395, filed on May 22, 1998, entitled "Electro-Optic Device," issued as U.S. Pat. No. 5,908,305, and also in U.S. patent application Ser. No. 09/874,999, filed on Jun. 7, 2001, entitled "Electro-Optic Device," issued as U.S. Pat. No. 6,801,702, and also in U.S. patent application Ser. No. 10/468,938, filed on Jul. 15, 2004, entitled "Electro-Optic Modulator," issued as U.S. Pat. No. 7,684,655, and also in U.S. patent application Ser. No. 10/371,642, filed on Feb. 21, 2003, entitled "Attenuator Having Optical Loss in the Pass Mode," issued as U.S. Pat. No. 6,853,793, and also in U.S. patent application Ser. No. 09/116,082, filed on Jul. 15, 1998, entitled "Optical Waveguide Attenuation," issued as U.S. Pat. No. 6,021,248, each of which is incorporated herein in its entirety. The attenuator structure and/or methods of attenuator fabrication disclosed in any these patent applications individually or in combination can be employed in a multi-channel device constructed according to FIG. 1A through FIG. 5.

A suitable structure and/or methods of light monitor fabrication are disclosed in U.S. Provisional patent application Ser. No. 12/804,769, filed on Jul. 28, 2010, entitled "Light Monitor Configured to Tap Portion of Light Signal from Mid-Waveguide," and also in U.S. Utility Patent Application serial number (not yet assigned), filed on Jul. 28, 2010, entitled "Light Monitor Configured to Tap Portion of Light Signal from Mid-Waveguide," and also in U.S. patent application Ser. No. 10/161,208, filed on May 31, 2002, entitled "Waveguide Tap Monitor," issued as U.S. Pat. No. 6,885,794, each of which is incorporated herein in its entirety. The monitor structure and/or methods of monitor fabrication disclosed in these patent applications can be employed in a multi-channel device constructed according to FIG. 1A through FIG. 5.

Figure 11:
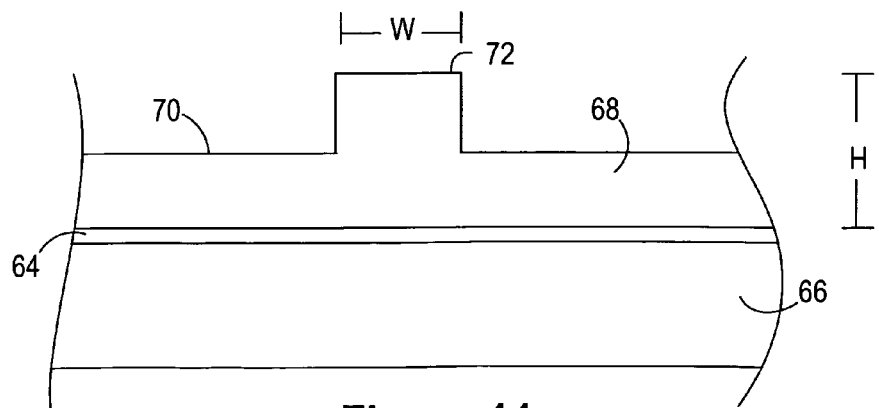
FIG. 11 is a cross section of a waveguide on a silicon-on-insulator wafer. The waveguide has a width labeled W. The width is the width of the ridge at the top of the ridge. The waveguide also has a thickness labeled H.

FIG. 11 is a cross section of a waveguide on a silicon-on-insulator wafer. As noted above, the cavity waveguides 19, the multiplexed signals waveguide 21, the second cavity waveguides 23, the channel waveguides 24, and the output waveguide 25 can each have a structure according to FIG. 11. The waveguide has a width labeled W. The width is the width of the ridge at the top of the ridge. The waveguide also has a thickness labeled H. The thickness is the thickness of the silicon where the light signal is carried. For instance, the thickness extends from the top of the silica layer 64 to the top of the ridge. The cross sectional area of the waveguide is equal to the width, W, multiplied by the thickness, H. The light signal may extend outside of this cross sectional area as the light signal travels through the waveguide. The intensity modulator and the phase modulator illustrated in FIG. 10A through FIG. 10E is more efficient and faster as the waveguide cross-section decreases. In one example, the first branch waveguide 52 and the second branch waveguide 53 have a cross sectional area of about 1 $\mu m^2$.

An echelle grating such as the echelle grating 30 illustrated in FIG. 8A and FIG. 8B has more loss as the thickness of the echelle grating increases. The thickness is the thickness of the silicon where the light signal is carried. Accordingly, the thickness can be from the top of the silica to the top of the silicon slab 68 in the free space region.

In some instances, the cavity waveguides 19, the multiplexed signals waveguide 21, the second cavity waveguides 23, and the channel waveguides 24 all have about the same cross-sectional dimensions but the output waveguide 25 has larger cross-sectional dimensions. This arrangement permits the modulators and echelle gratings to have the dimensions that are desired for efficient operation of the echelle grating and the modulators while permitting the output waveguide 63 to have the dimensions desired for other applications.

Figure 12A:
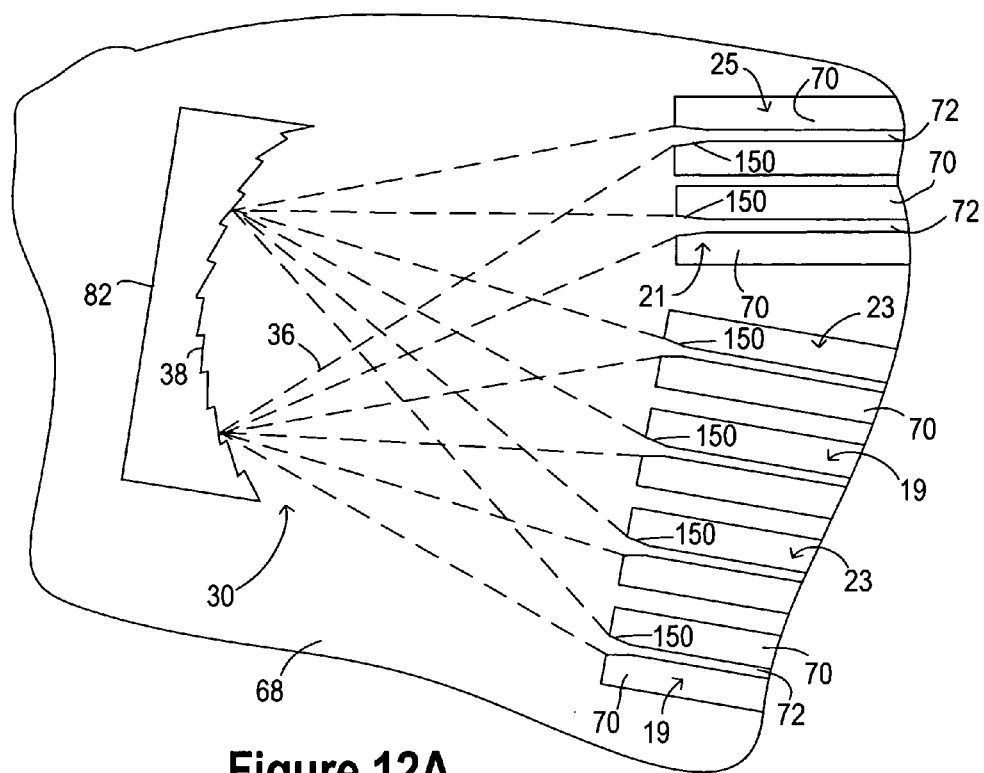
FIG. 12A is a topview of a portion of the multi-channel device having an interface between an echelle grating, a cavity waveguide, and a channel waveguides. The channel waveguides each include a taper.

In some instances, waveguide tapers can be employed to vary the cross-sectional dimensions of the waveguides. For instance, FIG. 12A is a topview of the interface between the echelle grating 30, cavity waveguides 19, second cavity waveguides 23, multiplexed signals waveguide 21, and an output waveguide 25 on a silicon-on-insulator wafer. Each of the waveguides include a horizontal taper 150. The taper 150 can reduce the cross-sectional dimension of the channel waveguides 24 to dimensions that are suitable for efficient operation of the modulators. Each taper 150 can have a horizontal taper 150 without a vertical taper, or can have a vertical taper and horizontal taper. Although FIG. 12A illustrates the tapers 150 as having a horizontal taper, the tapers can also have a vertical taper or can have a vertical taper without a horizontal taper.

Figure 12B:
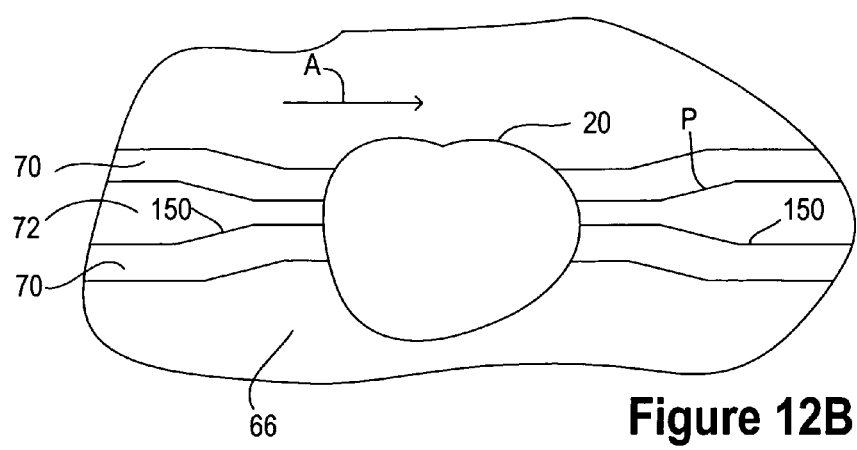
FIG. 12B is a topview of a portion of a multi-channel device having a modulator positioned between waveguide tapers.

In addition to the tapers illustrated in FIG. 12A or as an alternative to the tapers illustrated in FIG. 12A, tapers 150 can be employed in conjunction with the modulator. For instance, FIG. 12B illustrates the modulator positioned between tapers 150. The direction of the channels through the modulator and the tapers is illustrated by the arrow labeled A. Each taper can have a horizontal taper without a vertical taper, or can have a vertical taper and horizontal taper. Although FIG. 12A illustrates the tapers as having a horizontal taper, the tapers can also have a vertical taper or can have a vertical taper without a horizontal taper. The taper can reduce the cross-sectional dimension of the channel waveguides 24 to dimensions that are suitable for efficient operation of the modulators. In some instances, one of the tapers is not employed. For instance, the taper labeled P need not be employed.

The modulator illustrated in FIG. 12B can be the modulator of FIG. 1A. For instance, the modulator can be the intensity modulator of FIG. 10A, the phase modulator of FIG. 10B, or the phase modulator of FIG. 10F. Further, the modulator can be a phase modulator of FIG. 10B included in an intensity modulator of FIG. 10A.

Suitable structures for the tapers and methods for fabricating the tapers are provided in U.S. patent application Ser. No. 10/345,709, filed on Jan. 15, 2003, entitled "Controlled Selectivity Etch for Use with Optical Component Fabrication," and incorporated herein in its entirety. The disclosed structures and methods can be employed for the tapers illustrated in FIG. 12A and FIG. 12B.

As noted above in the context of FIG. 3, the multi-channel device can be constructed such that one or more multiplexers multiplexes channels from two or more laser cavities. When one or more multiplexers multiplex the channels from different laser cavities, the different laser cavities and the multiplexer can be included on the same multi-channel device. For instance, the different laser cavities and the multiplexer can be included on the same wafer. For instance, the different laser cavities and the multiplexer can be included on a silicon-on-insulator wafer.

Although the multi-channel device is disclosed in the context of a silicon-on-insulator wafer, the multi-channel device can be built into other platforms. Additionally, the multi-channel device is disclosed in the context of ridge waveguides. However, the multi-channel device can be constructed using other waveguides including, but not limited to, buried channel waveguides 40.

Other embodiments, combinations and modifications of this invention will occur readily to those of ordinary skill in the art in view of these teachings. Therefore, this invention is to be limited only by the following claims, which include all such embodiments and modifications when viewed in conjunction with the above specification and accompanying drawings.

The invention claimed is:

1. A multi-channel optical device, comprising:
multiple laser cavities that each reflects a different channel back and forth between reflective components, one of the reflective components being a common reflective device, the common reflective device receiving the channels from each of the laser cavities and reflecting the received channels,
a multiplexer configured to receive the channels reflected by the common reflective device and to demultiplex the channels into demultiplexed channels;
a portion of the reflective components being partial return devices that each receives one of the demultiplexed channels,
each of the partial return devices configured to transmit a portion of the demultiplexed channel received by that partial return device such that the transmitted portion exits the laser cavity, and
each of the partial return devices configured to reflect a portion of the demultiplexed channel received by that partial return device; and
the multiplexer also being configured to receive the transmitted portions of the channels and to multiplex the transmitted portions into an output beam.

2. The device of claim 1, wherein the demultiplexed channels each travels from the multiplexer to a common gain medium such that each of the demultiplexed channels is received at the common gain medium.

3. The device of claim 1, wherein the multiplexer and one or more gain media are optically between the common reflective device and the partial return devices.

4. The device of claim 3, wherein multiple gain media are optically between the common reflective device and the partial return devices such that each gain medium receives a different selection of the demultiplexed channels.

5. The device of claim 3, wherein each of the gain media includes one or more waveguides defined in the gain medium, the gain waveguides receiving the demultiplexed channels such that each gain waveguide guides a different one of the channels through the gain medium.

6. The device of claim 3, wherein the one or more gain media receive the reflected portions of the demultiplexed channels.

7. The device of claim 3, further comprising:
second cavity waveguides that each receives one of the channels from one of the gain media, each second cavity waveguide including one of the partial return devices.

8. The device of claim 7, wherein each second cavity waveguide is included in an optical coupler, each optical coupler including a coupled waveguide optically coupled with one of the second cavity waveguides such that a portion of a channel traveling along the second cavity waveguide enters the coupled waveguide.

9. The device of claim 8, wherein the coupled waveguides include a reflector configured to reflect at least a portion of the channel that enters the coupled waveguide back onto the coupled channel waveguide.

10. The device of claim 9, wherein the reflector is positioned at a terminal end of the coupled waveguide.

11. The device of claim 3, further comprising:
cavity waveguide that each carry one of the channels back and forth between one of one or more gain media and the multiplexer.

12. The device of claim 11, wherein one or more optical attenuators is positioned along each of the cavity waveguides such that each cavity waveguides carries one of the channels to the one or more optical attenuators positioned along the cavity waveguide and also carries that channel away from the one or more optical attenuators positioned along the cavity waveguide.

13. The device of claim 12, further comprising:
light monitors that are each optically located between the multiplexer and one of the partial return devices, each light monitor receiving at least a portion of the channel transmitted by one of the partial return devices.

14. The device of claim 12, further comprising:
electronics configured to operate one or more of the optical attenuators in response to output from one or more of the light monitors.

15. The device of claim 1, further comprising:
light monitors that are each optically located between the multiplexer and one of the partial return devices, each light monitor receiving at least a portion of the channel transmitted by one of the partial return devices.

16. The device of claim 1, further comprising:
modulators that are each optically located between the multiplexer and one of the partial return devices, each modulator receiving at least a portion of the channel transmitted by one of the partial return devices.

17. The device of claim 16, further comprising:
light monitors that are each optically located between the multiplexer and one of the partial return devices, each light monitor receiving at least a portion of one of the channels after that portion of the channel has been received at one of the modulators.

18. The device of claim 17, further comprising:
electronics configured to operate one or more of the modulators in response to output from one or more of the light monitors.

* * * * *